United States Patent
Abe et al.

(10) Patent No.: US 10,755,916 B2
(45) Date of Patent: Aug. 25, 2020

(54) SUBSTRATE TREATMENT METHOD AND SUBSTRATE TREATMENT APPARATUS

(71) Applicant: SCREEN Holdings Co., Ltd., Kyoto (JP)

(72) Inventors: Hiroshi Abe, Kyoto (JP); Manabu Okutani, Kyoto (JP); Takashi Ota, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 1 day.

(21) Appl. No.: 16/053,868

(22) Filed: Aug. 3, 2018

(65) Prior Publication Data

US 2019/0096705 A1    Mar. 28, 2019

(30) Foreign Application Priority Data

Sep. 22, 2017  (JP) .................................. 2017-182358

(51) Int. Cl.
*H01L 21/02* (2006.01)
*H01L 21/67* (2006.01)
(Continued)

(52) U.S. Cl.
CPC ........ *H01L 21/02057* (2013.01); *B05D 1/005* (2013.01); *H01L 21/02052* (2013.01); *H01L 21/67051* (2013.01); *H01L 21/67103* (2013.01); *H01L 21/67248* (2013.01); *H01L 21/6875* (2013.01); *H01L 21/68728* (2013.01); *H01L 21/68742* (2013.01); *H01L 21/68792* (2013.01)

(58) Field of Classification Search
CPC combination set(s) only.
See application file for complete search history.

(56) References Cited

U.S. PATENT DOCUMENTS

| 9,259,758 B2 | 2/2016 | Emoto et al. ................. 427/240 |
| 2014/0065295 A1 | 3/2014 | Emoto et al. ..................... 427/8 |

(Continued)

FOREIGN PATENT DOCUMENTS

| JP | 2014-197571 | 10/2014 |
| JP | 2015-177109 A | 10/2015 |
| JP | 2015-211122 A | 11/2015 |

OTHER PUBLICATIONS

Office Action and Search Report dated May 28, 2019 in counterpart Taiwanese Application No. 107128988, English translation of the Search Report is attached.

(Continued)

*Primary Examiner* — Erin F Bergner
(74) *Attorney, Agent, or Firm* — Ostrolenk Faber LLP

(57) ABSTRACT

A substrate processing method for processing a surface of a substrate includes: a first solvent supply step (a) of supplying IPA to a surface of a substrate while rotating the substrate to treat the surface; a modification treatment liquid supply step (b) of supplying a silylating solution after the first solvent supply step to form a liquid film; and a step (c) of heating the substrate in the first solvent supply step and the modification treatment liquid supply step. The step (c) is configured such that an amount of heat per unit time to be applied to the substrate in the modification treatment liquid supply step is larger than an amount of heat per unit time applied to the substrate in the first solvent supply step.

10 Claims, 12 Drawing Sheets

(51) Int. Cl.
*B05D 1/00* (2006.01)
*H01L 21/687* (2006.01)

(56) References Cited

U.S. PATENT DOCUMENTS

2014/0261554 A1* 9/2014 Hayashi .............. H01L 21/6704
134/19
2015/0258553 A1 9/2015 Kobayashi et al.

OTHER PUBLICATIONS

Notification of Reason for Refusal dated Dec. 12, 2019 in corresponding Korean Patent Application No. 10-2018-0103787 with English translation obtained from JPO.

* cited by examiner

SUBSTRATE TREATMENT METHOD AND SUBSTRATE TREATMENT APPARATUS

BACKGROUND OF THE INVENTION

Field of the Invention

The present invention relates to a substrate treatment method and a substrate treatment apparatus, treating a substrate with treatment liquid. Substrates to be treated include a semiconductor wafer, a substrate for a field emission display (FED) such as a liquid crystal display device and an organic electroluminescence (EL), a substrate for an optical disk, a substrate for a magnetic disk, a substrate for a magneto-optical disk, a substrate for a photomask, a ceramic substrate, and a substrate for a solar battery, for example.

Description of the Background Art

In manufacturing processes of semiconductor devices and liquid crystal display devices, a substrate surface may be treated with a predetermined modification treatment liquid in some cases so that its chemical properties are changed to desired properties.

For example, Japanese Patent Application Laid-Open No. 2014-197571 discloses a substrate having a surface on which a fine pattern is formed, the substrate being treated with a silane coupling agent solution (silylating solution) so that a hydrophobic protective film is formed on the surface of the substrate to make the surface of the substrate hydrophobic. When the surface of the substrate is made hydrophobic, wettability of a treatment liquid (specifically, IPA) decreases to enable collapse of the pattern to be suppressed.

Japanese Patent Application Laid-Open No. 2014-197571 also describes a hydrophobic liquid supply step of treating a substrate W with a silylating solution, in which the substrate W is heated to increase reactivity of the silylating solution. In addition, there is described a first organic solvent supply step of treating a substrate with the IPA before the substrate is treated with the silylating solution, in which the substrate is preheated.

In Japanese Patent Application Laid-Open No. 2014-197571, the substrate is heated in the hydrophobic liquid supply step so as to have the same temperature as in the first organic solvent supply step. In this case, the silylating solution supplied to the substrate W may not be sufficiently heated to cause hydrophobization of the substrate to be difficult in being promoted.

SUMMARY OF THE INVENTION

The present invention is directed to a substrate treatment method for treating a substrate surface.

According to the present invention, the substrate treatment method includes the steps of: (a) treating a substrate by supplying a first treatment liquid to a surface of the substrate while rotating the substrate; (b) forming a liquid film on the surface of the substrate after the step (a) by supplying a modification treatment liquid for changing surface chemical properties to the surface; and (c) heating the substrate in the steps (a) and (b), wherein the step (c) is configured such that an amount of heat per unit time to be applied to the substrate in the step (b) is more than an amount of heat per unit time to be applied to the substrate in the step (a).

According to the present invention, the substrate treated with the modification treatment liquid can be increased in temperature more than that treated with the first treatment liquid. This enables the modification treatment liquid to be heated to high temperature, so that reactivity of the modification treatment liquid can be increased.

It is preferable that the step (c) be a step of applying the above amount of heat to the substrate from a heating unit disposed on a back surface side of the substrate.

According to the present invention, the amount of heat is applied to the substrate from the heating unit on the back surface side of the substrate, so that the substrate can be heated well even in a state where liquid is supplied to the surface.

It is preferable that the step (c) include a step of increasing the amount of heat to be applied to the substrate by causing the heating unit to approach the substrate.

According to the present invention, causing the heating unit to approach the substrate enables the substrate to be heated to high temperature.

It is preferable that the step (c) include a step of increasing the amount of heat to be applied to the substrate by raising temperature of the heating unit.

According to the present invention, temperature of the substrate can be raised by raising temperature of the heating unit.

It is preferable that the step (b) include the steps of: (b-1) forming a liquid film of the modification treatment liquid by spreading the modification treatment liquid supplied to the rotating substrate on an outer peripheral portion of the substrate; and (b-2) maintaining the liquid film of the modification treatment liquid after the step (b-1), wherein the step (c) is configured such that the amount of heat per unit time to be applied to the substrate in the step (b-2) is more than the amount of heat per unit time to be applied to the substrate in the step (b-1).

According to the present invention, the substrate can be raised to a high temperature while the liquid film of the modification treatment liquid is maintained, or the modification treatment liquid is applied to the whole area of the substrate. This enables modification treatment to be performed well in the whole area of the substrate.

It is preferable that the step (c) be configured such that the amount of heat per unit time to be applied to the outer peripheral portion of the substrate is more than the amount of heat per unit time to be applied to a central portion of the substrate in the step (b-2).

According to the present invention, the amount of heat per unit time to be applied to the outer peripheral portion of the substrate is more than the amount of heat per unit time to be applied to a central portion of the substrate, so that the outer peripheral portion of the substrate can have uniform temperature particularly under conditions where the outer peripheral portion of the substrate is difficult to heat.

It is preferable to further include the step of: (d) supplying a second treatment liquid to the surface of the substrate while rotating the substrate after the step (b).

According to the present invention, when the modification treatment liquid remains on the substrate, the modification treatment liquid can be washed away by the second treatment liquid.

It is preferable that the step (c) include the step of heating the substrate in the step (d), and is configured such that the amount of heat per unit time to be applied to the substrate in the step (b) is more than the amount of heat per unit time to be applied to the substrate in the step (d).

According to the present invention, the second treatment liquid can be heated, so that substitution of the second treatment liquid can be promoted.

It is preferable that the step (c) be configured such that the amount of heat per unit time to be applied to the substrate in the step (a) is more than the amount of heat per unit time to be applied to the substrate in the step (d).

According to the present invention, the substrate can be preheated to a relatively high temperature to be treated with the first treatment liquid, so that the substrate can rapidly reach a target temperature to be treated with the modification treatment liquid. This enables modification treatment to be performed well.

It is preferable that the step (c) be configured such that the amount of heat per unit time to be applied to the substrate in the step (d) is more than the amount of heat per unit time to be applied to the substrate in the step (a), and that the second treatment liquid in the step (d) contains isopropyl alcohol.

According to the present invention, isopropyl alcohol can be substituted for the modification treatment liquid. In a step of supplying isopropanol, the first treatment liquid is heated to a temperature higher than a temperature when the first treatment liquid is supplied, so that the substitution of isopropanol for the modification treatment liquid can be promoted.

It is preferable to further include the step of: (e) drying the substrate by rotating the substrate at a higher speed than a rotation speed of the substrate in the step (a) after the step (b).

According to the present invention, a substrate can be dried by rotating the substrate at a high speed.

It is preferable that the first treatment liquid in the step (a) contain isopropyl alcohol.

According to the present invention, moisture of a substrate can be removed by treating the substrate with isopropyl alcohol. This enables surface modification of the substrate with the modification treatment liquid to be suitably performed.

In addition, the present invention is directed to a substrate treatment apparatus that treats a substrate surface.

According to the present invention, the substrate treatment apparatus includes: a rotation holding unit that rotates a substrate while holding it horizontally; a first treatment liquid supplying unit that supplies a first treatment liquid to a surface of the substrate held by the rotation holding unit; a modification treatment liquid supplying unit that supplies a modification treatment liquid for changing surface chemical properties of the substrate to a surface of the substrate held by the rotation holding unit to be able to form a liquid film of the modification treatment liquid on the surface; a heating unit that heats the substrate held by the rotation holding unit; and a control unit that controls the heating unit so as to increase an amount of heat per unit time to be applied to the substrate by the heating unit when the modification treatment liquid supplying unit supplies the modification treatment liquid to the substrate more than an amount of heat to be applied to the substrate by the heating unit when the first treatment liquid supplying unit supplies the first treatment liquid to the substrate.

Then, it is an object of the present invention to provide a technique capable of increasing reactivity of a modification treatment liquid to be supplied to a substrate.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
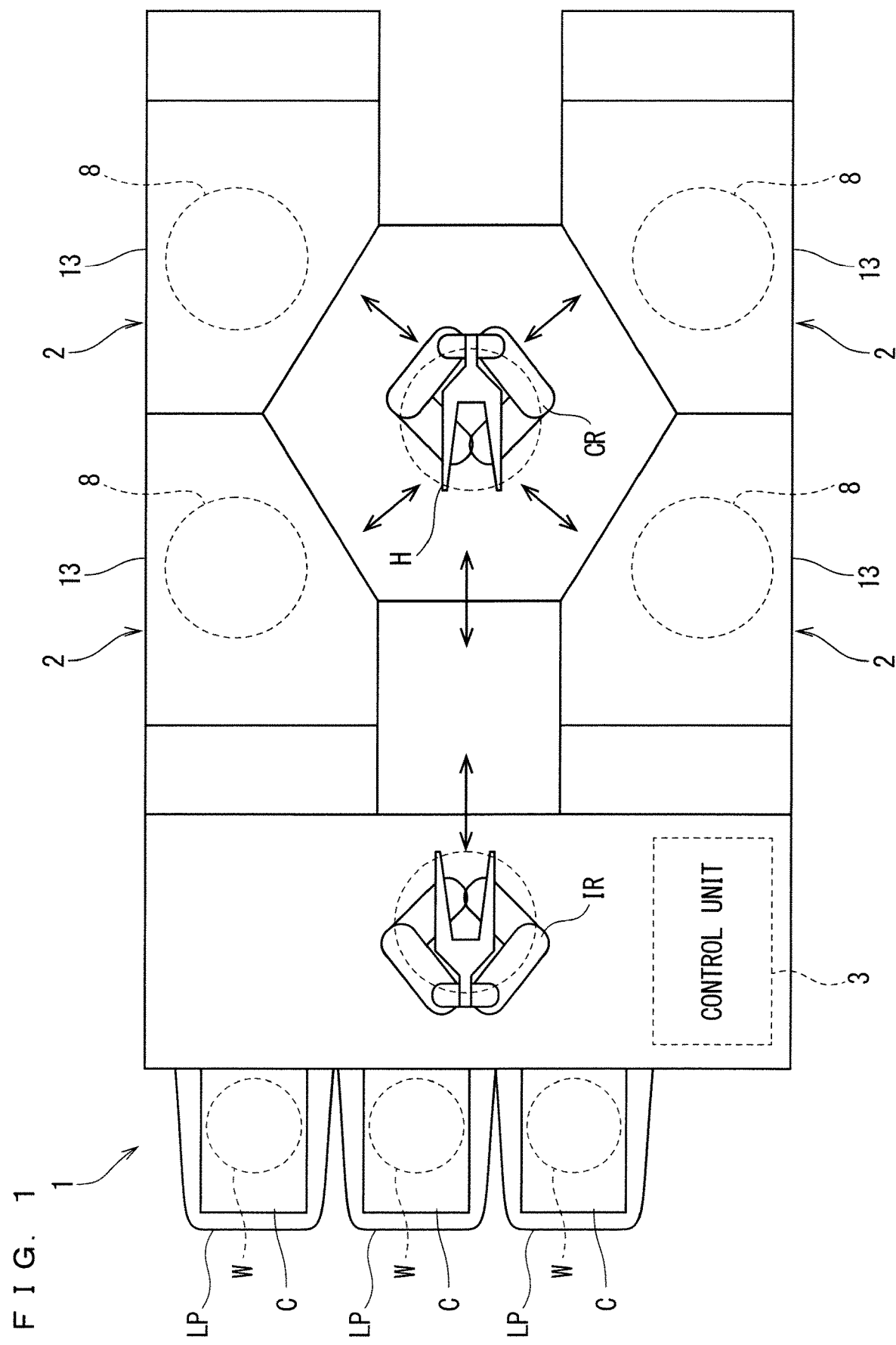
FIG. 1 is a schematic plan view for illustrating a layout inside a substrate treatment apparatus 1 according to a first preferred embodiment of the present invention.

Embodiments of the present invention will be described below with reference to accompanying drawings. Components described in the present preferred embodiments are each only an example, so that the scope of the present invention does not intend to be limited to only the components. The dimensions of components and the number of components may be illustrated in exaggeration or in simplified form, as appropriate, in the drawings, for the sake of easier understanding.

As used throughout this disclosure, the singular forms "a," "an," and "the" include plural reference unless the context clearly dictates otherwise. Thus, for example, a reference to "a composition" includes a plurality of such compositions, as well as a single composition.

1. First Preferred Embodiment

FIG. 1 is a schematic plan view for illustrating a layout inside a substrate treatment apparatus 1 according to a first preferred embodiment of the present invention. The substrate treatment apparatus 1 is a single wafer type apparatus that treats a substrate W such as a silicon wafer one by one. In the present preferred embodiment, the substrate W is formed in a disk-like shape.

The substrate treatment apparatus 1 includes a plurality of treatment units 2, a load port LP, a transport robot IR, a transport robot CR, and a control unit 3. The treatment unit 2 treats a substrate W with a treatment liquid. Each of the plurality of treatment units 2 has a similar configuration, for example. In the load port LP, a carrier C for housing a plurality of substrates W to be treated in the treatment unit 2 is placed. The transport robot IR transports a substrate W between the carrier C and the transport robot CR. The transport robot CR transports a substrate W between the transport robot IR and the treatment unit 2. The control unit 3 controls operation of each element of the substrate treatment apparatus 1.

Figure 2:
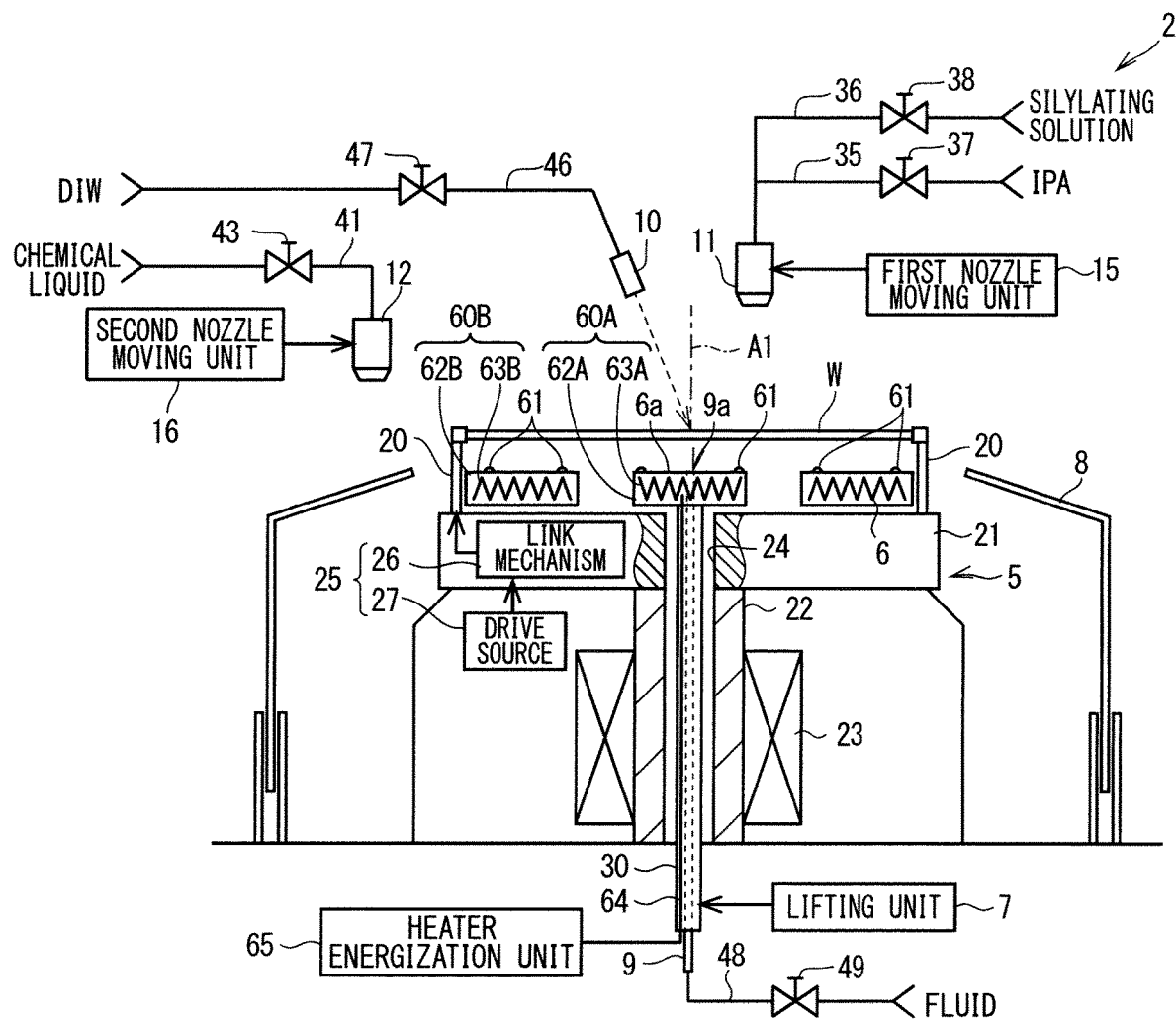
FIG. 2 is a schematic sectional view for illustrating a configuration example of a treatment unit 2 according to the first preferred embodiment.

FIG. 2 is a schematic sectional view for illustrating a configuration example of the treatment unit 2 according to the first preferred embodiment. The treatment unit 2 includes a spin chuck 5, a heater unit 6 as a heating unit, a lifting unit 7, a cup 8, an undersurface nozzle 9, a DIW nozzle 10, a first moving nozzle 11, a second moving nozzle 12, and a chamber 13 (refer to FIG. 1).

The spin chuck 5 rotate one substrate W about a vertical rotation axis A1 passing through a central portion of the one substrate W while holding the one substrate W in a horizontal posture. The heater unit 6 heats a substrate W from below the undersurface of the substrate W. The lifting unit 7 vertically moves the heater unit 6 below the substrate W. The cup 8 is formed in a cylindrical shape allowing the spin chuck 5 to be surrounded. The undersurface nozzle 9 supplies a treatment fluid to the undersurface of a substrate W. The DIW nozzle 10 supplies deionized water (DIW) as a rinse liquid to the top surface of a substrate W. The first and second moving nozzles 11 and 12 are configured to be movable above a substrate W. The chamber 13 is configured to be able to house the cup 8. The chamber 13 includes a transport-in-and-out port for transporting in and out a substrate W, and a shutter unit for opening and closing the transport-in-and-out port.

The spin chuck 5 includes a chuck pin 20 (chuck member), a spin base 21, a rotating shaft 22 connected to the center of an undersurface of the spin base 21, and an electric motor 23 that applies a rotating force to the rotating shaft 22. The rotating shaft 22 extends vertically along the rotation axis A1, and is a hollow shaft in the present preferred embodiment. The rotating shaft 22 is connected at its upper end to the spin base 21. The spin base 21 has a disk shape along a horizontal direction. The spin base 21 is provided in a peripheral portion of its top surface with a plurality of chuck pins 20 disposed at intervals in its circumferential direction.

The plurality of chuck pins 20 can be opened and closed between a closed state where the chuck pins 20 are brought into contact with the peripheral edge of a substrate W to grip the substrate W, and an open state where the chuck pins 20 are retracted from the peripheral edge of the substrate W. In the open state, the plurality of chuck pins 20 supports a substrate W from below by being brought into contact with the undersurface of a peripheral portion of the substrate W.

The chuck pins 20 are opened and closed by being driven by a chuck-pin drive unit 25. The chuck-pin drive unit 25 includes a link mechanism 26 built in the spin base 21, and a drive source 27 disposed outside the spin base 21, for example. The drive source 27 includes a ball screw mechanism and an electric motor that applies a driving force to the ball screw mechanism, for example.

The heater unit 6 is disposed above the spin base 21. The heater unit 6 has an undersurface to which a lifting shaft 30 extending vertically along the rotation axis A1 is connected. The lifting shaft 30 passes through a through-hole 24 formed in a central portion of the spin base 21, and the hollow rotating shaft 22. The lifting shaft 30 has a lower end extending downward from a lower end of the rotating shaft 22. The lifting shaft 30 is connected at its lower end to the lifting unit 7. When the lifting unit 7 is operated, the heater unit 6 is vertically moved within a range from a lower position near the top surface of the spin base 21 to an upper position for supporting the undersurface of a substrate W to lift the substrate W from the chuck pins 20.

The lifting unit 7 includes a ball screw mechanism and an electric motor that applies a driving force to the ball screw mechanism, for example. This causes the lifting unit 7 to dispose the heater unit 6 at any intermediate position between the lower position and the upper position. For example, in a state where a heating face 6a being the top surface of the heater unit 6 is disposed at a position spaced from the undersurface of a substrate W by a predetermined distance, the substrate W can be heated by radiant heat from the heating face 6a. When a substrate W is lifted by the heater unit 6, the substrate W can be heated by heat conduction from the heating face 6a with a larger amount of heat in a contact state where the heating face 6a is in contact with the undersurface of the substrate W.

The first moving nozzle 11 is moved horizontally and vertically by the first nozzle moving unit 15. The first moving nozzle 11 is moved horizontally between a treatment position that faces a rotation center of the top surface of a substrate W and a home position (retracted position) that does not face the top surface of the substrate W. The "rotation center of the top surface of a substrate W" is an intersection of the top surface of the substrate W and the rotation axis A1. The "home position that does not face the top surface of the substrate W" may be a position outside the spin base 21 in plan view, specifically, a position outside the cup 8.

The first moving nozzle 11 is moved vertically to approach the top surface of a substrate W and to retract upward from the top surface of the substrate W. The first nozzle moving unit 15 includes a rotating shaft extending along a vertical direction, an arm connected to the rotating shaft while extending horizontally, and an arm driving mechanism for driving the arm, for example. The arm driving mechanism oscillates the arm by rotating the rotating shaft around a vertical rotation axis, and vertically moves the arm by moving up and down the rotating shaft along the vertical direction. The first moving nozzle 11 is to be fixed to the arm. The first moving nozzle 11 moves horizontally and vertically as the arm is oscillated and moved up and down.

The second moving nozzle 12 is moved horizontally and vertically by the second nozzle moving unit 16. The second moving nozzle 12 is moved horizontally between a position that faces a rotation center of the top surface of a substrate W and a home position (retracted position) that does not face the top surface of the substrate W. The "home position" may be a position outside the spin base 21 in plan view, specifically, a position outside the cup 8.

The second moving nozzle 12 is moved vertically to approach the top surface of a substrate W and to retract upward from the top surface of the substrate W. The second nozzle moving unit 16 includes a rotating shaft extending along a vertical direction, an arm connected to the rotating shaft and extending horizontally, and an arm driving mechanism for driving the arm, for example. The arm driving mechanism oscillates the arm by rotating the rotating shaft around a vertical rotation axis, and vertically moves the arm by moving up and down the rotating shaft along the vertical direction. The second moving nozzle 12 is to be fixed to the arm. The second moving nozzle 12 moves horizontally and vertically as the arm is oscillated and moved up and down.

In the present preferred embodiment, the first moving nozzle 11 has a function as an organic solvent nozzle for discharging an organic solvent. The first moving nozzle 11 is connected to an organic solvent supply pipe 35. The organic solvent supply pipe 35 is provided with an organic solvent valve 37 for opening and closing a flow channel thereof. The organic solvent supply pipe 35 is supplied with an organic solvent such as isopropyl alcohol (IPA) from an organic solvent supply source.

In the present preferred embodiment, the first moving nozzle 11 also has a function as a hydrophobic liquid nozzle for supply a hydrophobic liquid as a surface treatment liquid. The first moving nozzle 11 is connected to a hydrophobic liquid supply pipe 36. The hydrophobic liquid supply pipe 36 is provided with a hydrophobic liquid valve 38 for opening and closing a flow channel thereof. The hydrophobic liquid supply pipe 36 is supplied with a hydrophobic liquid such as a silane coupling agent solution (hereinafter referred to as a "silylating solution") from a hydrophobic liquid supply source. The silylating solution forms a hydrophobic protective film 106 (refer to FIG. 12) on a surface of a substrate W to make the surface of the substrate W hydrophobic.

As described below, the silylating solution is supplied to the substrate W to make the surface of the substrate W hydrophobic prior to drying the substrate W in the present preferred embodiment. When the surface (including the surface of a pattern) of the substrate W is made hydrophobic before drying as described above, a contact angle of liquid on the surface of the substrate W can be brought close to a right angle. This enables collapse of the pattern on the substrate W to be effectively suppressed.

In the present preferred embodiment, the second moving nozzle 12 has a function as a chemical liquid nozzle for supplying a chemical liquid such as acid and alkali. The second moving nozzle 12 is connected to a chemical liquid supply pipe 41. The chemical liquid supply pipe 41 is provided with a chemical liquid valve 43 for opening and closing a flow channel thereof. The chemical liquid supply pipe 41 is supplied with a chemical liquid such as acid and alkali from a chemical liquid supply source.

The chemical liquid is an etching liquid or a cleaning liquid, for example. More specifically, the chemical liquid is hydrofluoric acid, a mixed solution of ammonia hydrogen peroxide (SC1), a mixed solution of hydrochloric acid and hydrogen peroxide (SC2), buffered hydrofluoric acid (a mixed solution of hydrofluoric acid and ammonium fluoride), or the like.

In the present preferred embodiment, the DIW nozzle 10 is a nozzle fixed to a position to allow DIW to be discharged toward the rotation center of the top surface of the substrate W. The DIW nozzle 10 is supplied with DIW from a DIW supply source through a DIW supply pipe 46. The DIW supply pipe 46 is provided with a DIW valve 47 for opening and closing a flow channel thereof. The DIW nozzle 10 does not need to be a fixed nozzle, and may be a moving nozzle movable in a horizontal direction, for example.

The undersurface nozzle 9 passes through the hollow lifting shaft 30 and further passes through the heater unit 6 (more specifically, a first heater plate 60A). The undersurface nozzle 9 is provided at its upper end with a discharge port 9a facing the center of the undersurface of a substrate W. The undersurface nozzle 9 is supplied with a treatment fluid from a fluid supply source trough a fluid supply pipe 48. The treatment fluid to be supplied may be a liquid or a gas. The fluid supply pipe 48 is provided with a fluid valve 49 for opening and closing a flow channel thereof.

Figure 3:
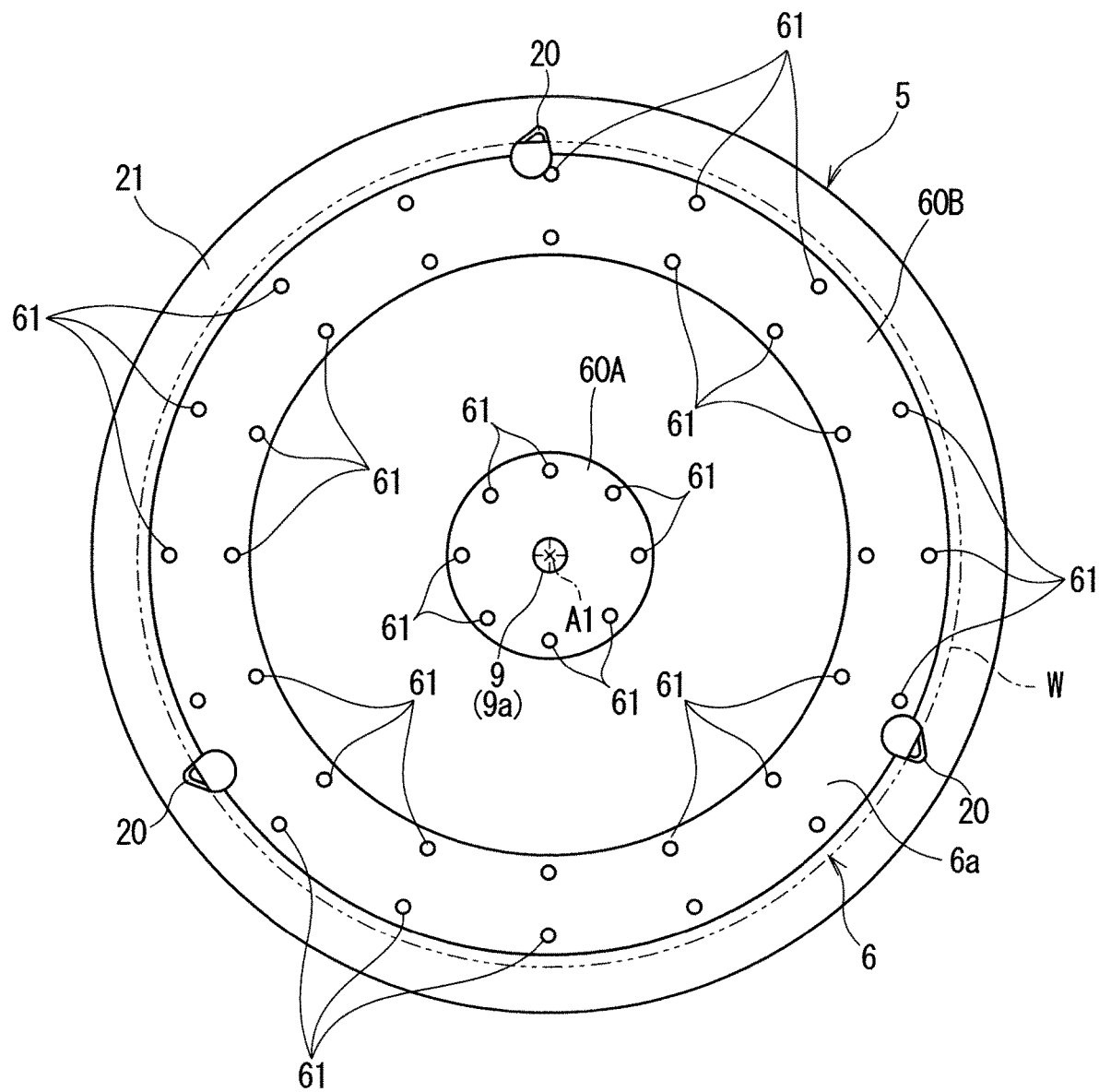
FIG. 3 is a plan view of a spin chuck 5 and a heater unit 6 according to the first preferred embodiment.

FIG. 3 is a plan view of the spin chuck 5 and the heater unit 6 according to the first preferred embodiment. The spin base 21 of the spin chuck 5 has a circular shape centered on the rotation axis A1 in plan view, and has a diameter larger than the diameter of a substrate W. The spin base 21 is provided in its peripheral portion with a plurality (three in the present preferred embodiment) of chuck pins 20 disposed at intervals.

Figure 4:
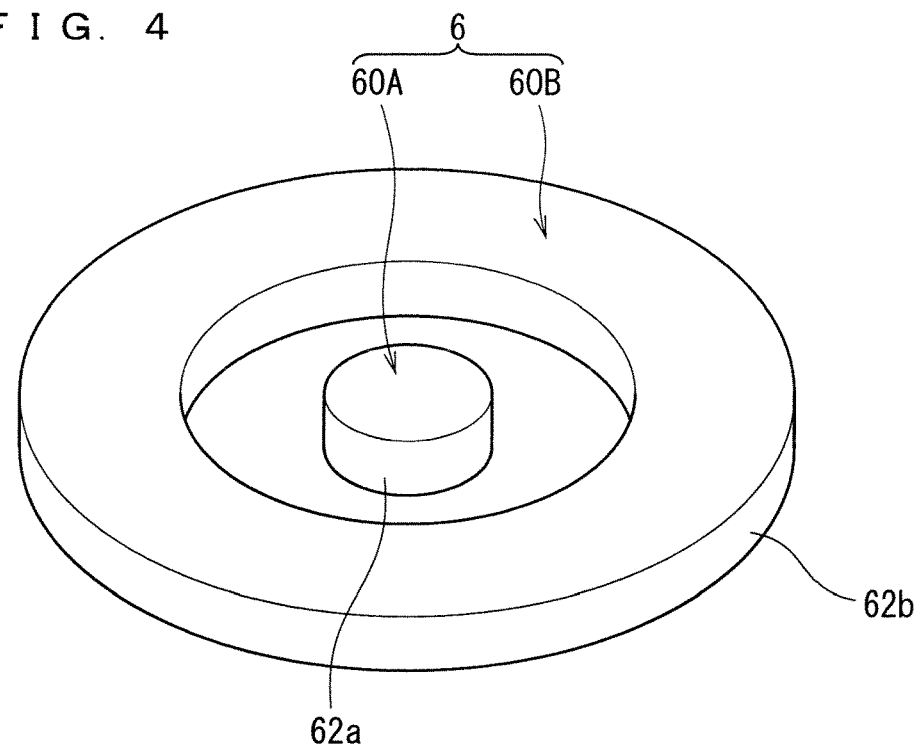
FIG. 4 is a schematic perspective view illustrating first and second heater plates 60A and 60B provided in the heater unit 6.

FIG. 4 is a schematic perspective view illustrating the first and second heater plates 60A and 60B provided in the heater unit 6. The first heater plate 60A is formed in a disk shape centered on the rotation axis A1. The second heater plate 60B is a plate-like member formed in an annular shape surrounding the outer peripheral portion of the first heater plate 60A. The first and second heater plates 60A and 60B are each disposed between the top surface of the spin base 21 and the undersurface of the substrate W held by the spin chuck 5. The first and second heater plates 60A and 60B are connected to each other with a connecting member (not illustrated).

As illustrated in FIG. 2, the first heater plate 60A includes a first body part 62A made of ceramics and a first heater 63A built in the first body part 62A, for example. The first body part 62A has a top surface formed in a circular flat shape facing a central portion of the undersurface of a substrate W held by the spin chuck 5. The top surface of the first body part 62A faces a circular region having a diameter of about a quarter of a wafer diameter centered on the rotation axis on the undersurface of the substrate W, for example.

The second heater plate 60B includes a second body part 62B made of ceramics and a second heater 63B built in the second body part 62B, for example. The second body part 62B has a top surface formed in a circular flat shape facing a peripheral portion of the undersurface of a substrate W held by the spin chuck 5. The top surface of each of the first and second body parts 62A and 62B forms the same horizontal plane. The first heater 63A and the second heater 63B each have a substantially identical heating value per unit area.

The top surface of the second heater plate 60B faces an annular region on the undersurface of a substrate W (an annular region excluding a circular region having a diameter about ¾ of the wafer diameter centered on the rotation axis), for example.

The first and second body parts 62A and 62B are each provided in its top surface with a plurality of support pins 61 projecting upward from the top surface (refer to FIG. 2). Each of the support pins 61 is formed in a hemispherical shape and projects by a minute height (e.g., 0.1 mm) from the top surface of the corresponding one of the first and second body parts 62A and 62B, for example. When a substrate W is brought into contact with the plurality of support pins 61 to be supported thereby, the undersurface of the substrate W faces the top surfaces of the respective first and second body parts 62A and 62B at a minute interval of 0.1 mm, for example. When a substrate W is supported at a plurality of positions close to the corresponding first and second body parts 62A and 62B, the substrate W can be efficiently and uniformly heated.

The plurality of support pins 61 is not indispensable. When the support pins 61 are not provided, the substrate W can be brought into contact with the top surfaces of the respective first and second body parts 62A and 62B. The heating face 6a of the heater unit 6 includes the top surfaces of the respective first and second body parts 62A and 62B, and the surfaces of the respective support pins 61, when the support pins 61 are provided. When the support pins 61 are not provided, the top surfaces of the respective first and second body parts 62A and 62B correspond to the heating face 6a. Hereinafter, a state where the undersurface of a substrate W is in contact with the support pins 61 may be referred to as the undersurface of the substrate W being in contact with the heating face 6a.

The first and second heaters 63A and 63B may be resistors built in the corresponding first and second heater plates 60A and 60B. When the first and second heaters 63A and 63B are energized, the heating face 6a is heated to a temperature higher than room temperature (e.g., 20 to 30° C., or 25° C.). Specifically, the heating face 6a is heated to a temperature higher than the boiling point of each of treatment liquids supplied from the corresponding first and second moving nozzles 11 and 12 when the first and second heaters 63A and 63B are energized. As illustrated in FIG. 2, a power supply line 64 to the first and second heaters 63A and 63B is inserted into the lifting shaft 30. The power supply line 64 is connected to a heater energization unit 65 that supplies electric power to the first and second heaters 63A and 63B. The heater energization unit 65 may be energized at all times during operation of the substrate treatment apparatus 1.

The support pins 61 are disposed substantially evenly on the top surfaces of the respective first and second heater plates 60A and 60B. The chuck pins 20 are disposed outside the outer peripheral edge of the second heater plate 60B. The entire chuck pin 20 is not required to be disposed outside the outer peripheral edge of the second heater plate 60B, and the chuck pin 20 is required to have a portion facing a vertical movement range of the heater unit 6, the portion being located outside the outer peripheral edge of the second heater plate 60B.

Here, the lifting shaft 30 is connected to the first heater plate 60A. As the first heater plate 60A is moved up and down by the lifting shaft 30, the second heater plate 60B is also moved up and down together with the first heater plate 60A.

While the heater unit 6 is separated into the first and second heater plates 60A and 60B in the present preferred embodiment, this is not indispensable. The heater unit 6 may be composed of a single disc-shaped heater plate. A heater serving as a heat source similar to each of the first and second heaters may be disposed at an appropriate position inside the single disc-shaped heater plate. In this case, the heater plate faces the entire back surface (except for the peripheral portion) of a substrate W.

Figure 5:
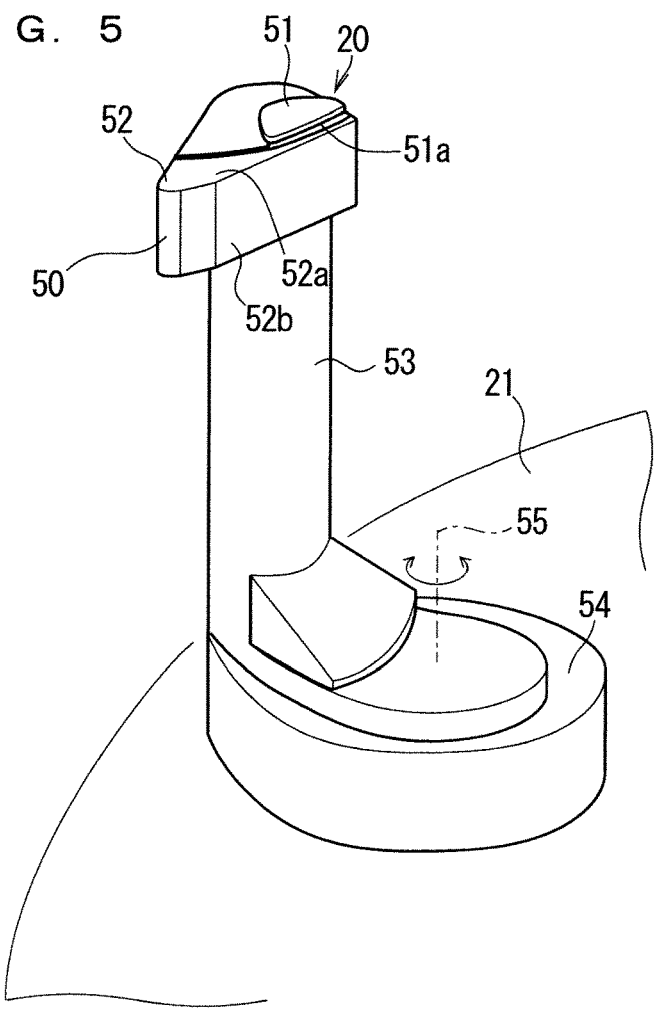
FIG. 5 is a perspective view for illustrating a structural example of a chuck pin 20.
Figure 6A:
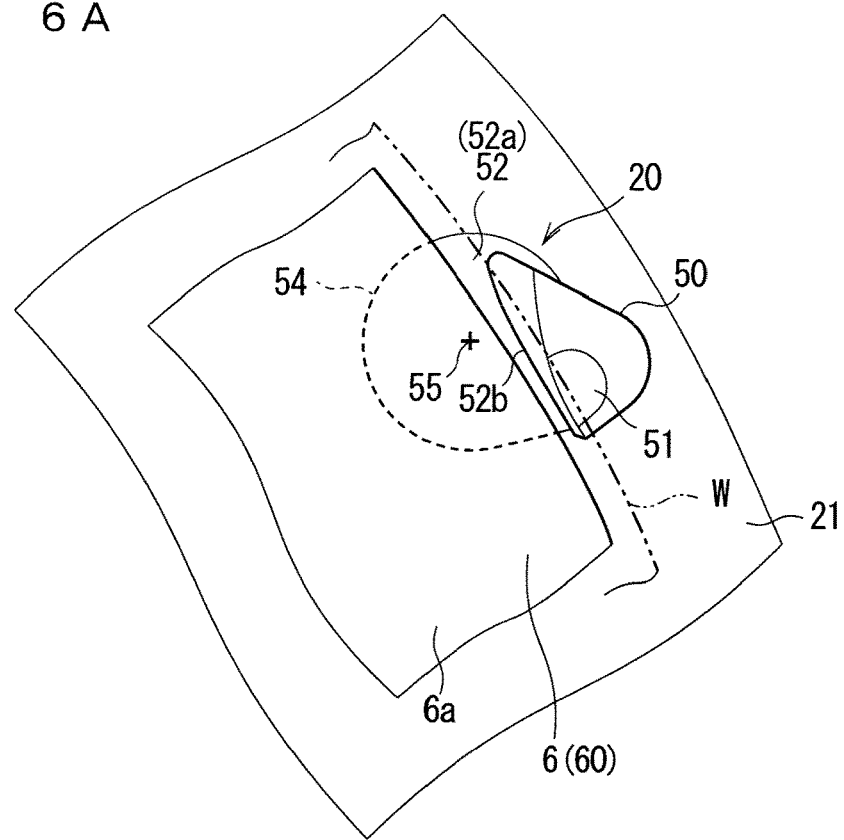
FIGS. 6A and 6B each is a plan view of the chuck pin 20.
Figure 6B:
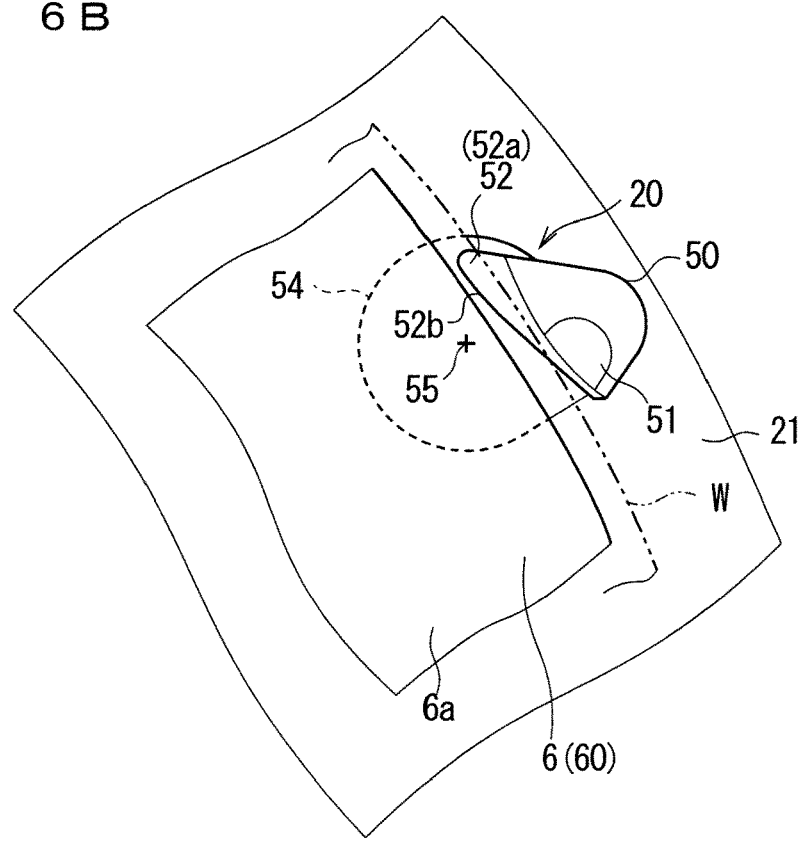

FIG. 5 is a perspective view for illustrating a structural example of the chuck pin 20. FIGS. 6A and 6B each is a plan view of the chuck pin 20. FIG. 6A shows a closed state and FIG. 6B shows an open state.

The chuck pin 20 includes a shaft portion 53 extending vertically, a base portion 50 provided at an upper end of the shaft portion 53, and a rotation support portion 54 provided at a lower end of the shaft portion 53. The base portion 50 includes a holding portion 51 and a support portion 52. The rotation support portion 54 is connected to the spin base 21 so as to be rotatable around a chuck rotation axis 55 along a vertical direction. The shaft portion 53 is displaced to a position away from the chuck rotation axis 55 to be connected to the rotation support portion 54. More specifically, the shaft portion 53 is disposed at a position further away from the rotation axis A1 than the chuck rotation axis 55. Thus, when the chuck pin 20 is rotated around the chuck rotation axis 55, the entire base portion 50 rotates around the chuck rotation axis 55 while moving along a peripheral edge surface of the substrate W. The rotation support portion 54 is connected to a link mechanism 26 (refer to FIG. 2) provided inside the spin base 21. Driving force from the link mechanism 26 causes the rotation support portion 54 to oscillate around the chuck rotation axis 55 within a predetermined angular range. The peripheral edge surface of the substrate W is the outer peripheral surface of the substrate W, facing outward in the radial direction excluding a main surface (a surface having the largest area) of the surface of the substrate W.

The base portion 50 is formed in a wedge shape in plan view. The base portion 50 is provided in its top surface with a support surface 52a so that the support surface 52a is brought into contact with a undersurface of a peripheral portion of a substrate W to support the substrate W from below when the chuck pins 20 each are in the open state. In other words, the base portion 50 has the support portion 52 with the support surface 52a as its top surface. The holding portion 51 projects upward at a position different from the support portion 52 on the top surface of the base portion 50. The holding portion 51 has a holding groove 51a that is opened in a V-shape so as to face the peripheral edge surface of the substrate W.

When the rotation support portion 54 is rotated clockwise around the chuck rotation axis 55 from the open state illustrated in FIG. 6B, the holding portion 51 approaches the peripheral edge surface of a substrate W, and the support portion 52 moves away from the rotation center of the substrate W. When the rotation support portion 54 is rotated counterclockwise around the chuck rotation axis 55 from the closed state illustrated in FIG. 6A, the holding portion 51 moves away from the peripheral edge surface of a substrate W, and the support portion 52 approaches the rotation center of the substrate W.

In the closed state of the chuck pin 20 illustrated in FIG. 6A, the peripheral edge surface of a substrate W enters the holding groove 51a. At this time, the undersurface of the substrate W is positioned at a height away upward from the support surface 52a by a minute distance. In the open state of the chuck pin 20 illustrated in FIG. 6B, the peripheral edge surface of a substrate W comes out from the holding groove 51a, and the holding portion 51 is positioned outside the peripheral edge surface of the substrate W in plan view. In any one of the open and closed states of the chuck pin 20, at least a part of the support surface 52a is positioned below the undersurface of the peripheral portion of a substrate W.

When the chuck pin 20 is in the open state, the chuck pin 20 supports a substrate W with the support portion 52. When the chuck pin 20 is switched from the open state to the closed state, the peripheral edge surface of the substrate W is guided into the holding groove 51a while gradually rising by being guided by the holding groove 51a having a V-shaped cross section. As a result, the substrate W is held by upper and lower inclined surfaces of the holding groove 51a. When the chuck pin 20 is switched from the state to the open state, the peripheral edge surface of the substrate W slides down while being guided by the lower inclined surface of the holding groove 51a, and the undersurface of the peripheral portion of the substrate W is brought into contact with the support surface 52a.

As illustrated in FIGS. 6A and 6B, the base portion 50 is configured such that an edge portion of the heater unit 6, facing a plate body 60, follows a peripheral edge shape of the plate body 60 in plan view. That is, the support portion 52 has a side surface 52b positioned outside the plate body 60 with respect to the rotation center in plan view. As a result, the plate body 60 having the circular heating face 6a slightly smaller than the substrate W does not interfere with the chuck pin 20 when the heater unit 6 vertically moves. This non-interfering positional relationship is maintained in both the closed state and the open state of the chuck pin 20. That is, when the chuck pin 20 is in any one of the closed state and the open state, the side surface 52b of the support portion 52 is spaced outside the heating face 6a of the heater unit 6 in plan view. This enables the heater unit 6 to move up and down while allowing its heating face 6a to pass through inside the side surface 52b regardless of whether the chuck pin 20 is in the closed state or the open state.

A substrate W has a diameter of 300 mm, for example, and the top surface of the second heater plate 60B has a diameter of 294 mm, for example. This causes the top surface (heating face) of the second heater plate 60B to face a peripheral region of the undersurface of the substrate W held by the chuck pins 20. When the chuck pin 20 is in any one of the closed state and the open state, the support portion 52 is disposed while a predetermined minute gap (e.g., 2 mm) or more is secured outside the outer peripheral edge of the second heater plate 60B.

The holding portion 51 is configured such that an inner edge thereof is positioned while a predetermined minute gap (e.g., 2 mm) or more is secured outside the outer peripheral edge of the plate body 60 when the chuck pin 20 is in the closed state. Thus, in any one of the closed state and the open state of the chuck pins 20, the heater unit 6 can raise the heating face 6a to be brought into contact with the undersurface of the substrate W while allowing the heating face 6a to move up and down inside the holding portion 51.

In plan view, the chuck rotation axis 55 is positioned on the circumference of a circle having a radius smaller than a radius of the top surface of the second heater plate 60B, the circle being centered on the rotation axis A1 (refer to FIGS. 2 and 3).

Figure 7:
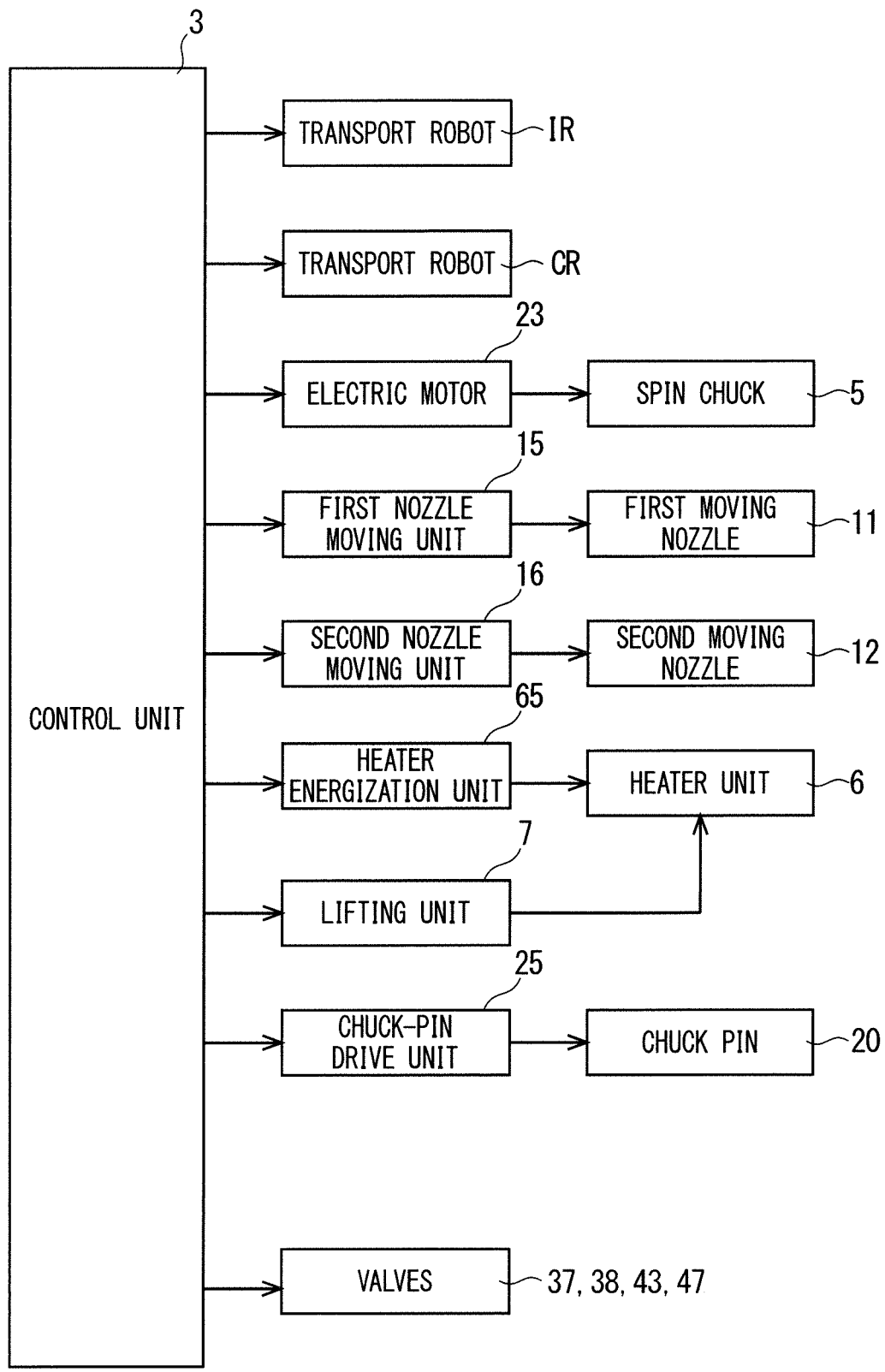
FIG. 7 is a block diagram for illustrating an electrical connection of a main section of the substrate treatment apparatus 1 according to the first preferred embodiment.

FIG. 7 is a block diagram for illustrating an electrical connection of a main section of the substrate treatment apparatus 1 according to the first preferred embodiment. The control unit 3 includes a microcomputer to control a control target provided in the substrate treatment apparatus 1 according to a predetermined control program. In particular, the control unit 3 controls operation of the transport robots IR and CR, the electric motor 23 for rotationally driving the spin chuck 5, the first nozzle moving unit 15, the second nozzle moving unit 16, the heater energization unit 65, the lifting unit 7 for moving up and down the heater unit 6, the chuck-pin drive unit 25, the valves 37, 38, 43, and 47, and the like.

<Description of Operation>

Figure 8:
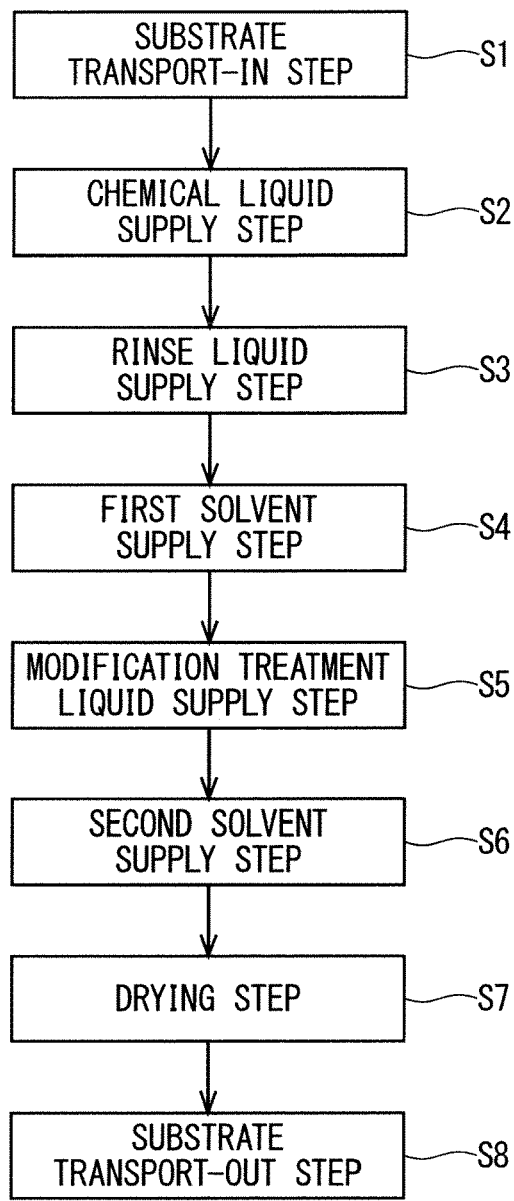
FIG. 8 is a flowchart for illustrating a first treatment example when a substrate W is treated by the substrate treatment apparatus 1 according to the first preferred embodiment.
Figure 9:
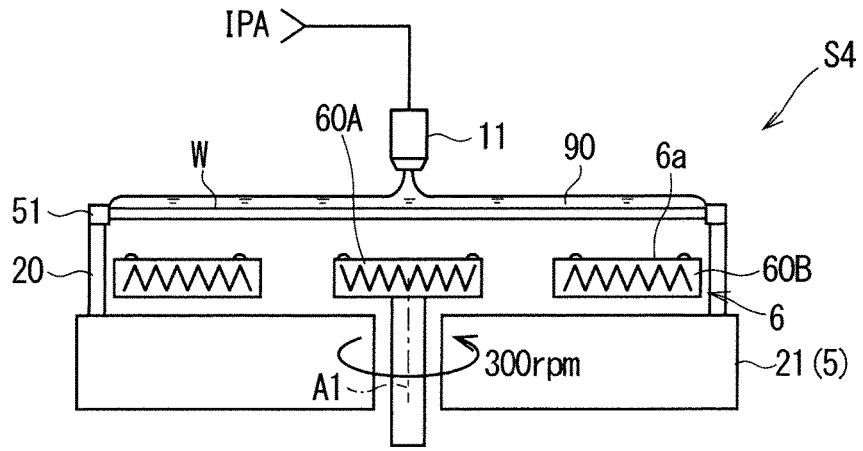
FIG. 9 is a schematic side view for illustrating a state of first solvent supply step S4.
Figure 10A:
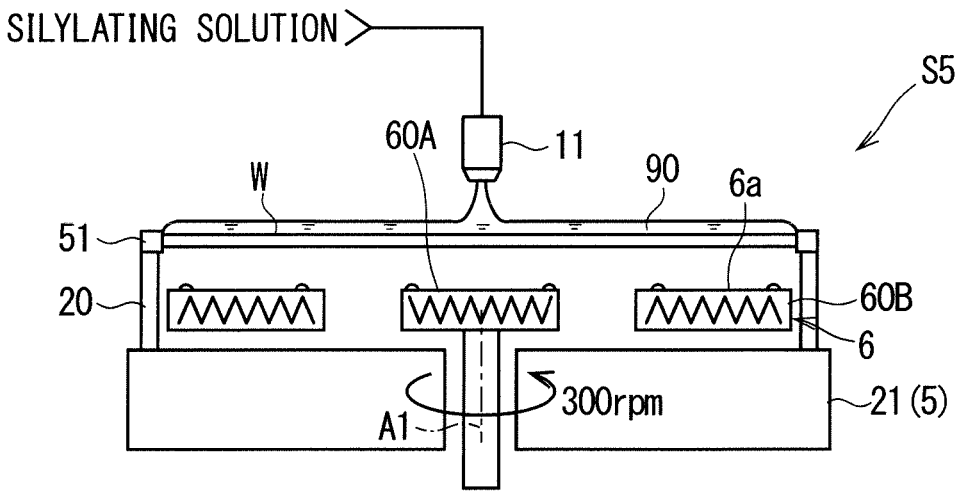
FIGS. 10A to 10C each is a schematic side view for illustrating a state of modification treatment liquid supply step S5.
Figure 10B:
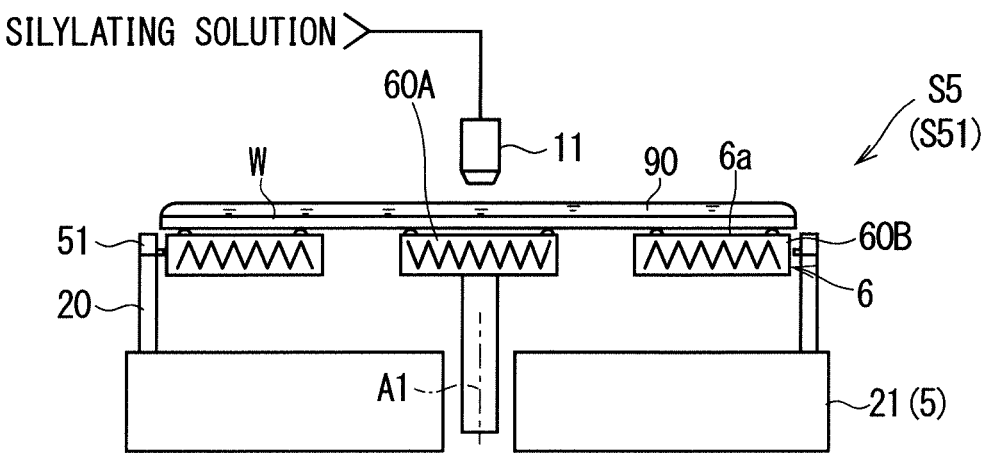
Figure 10C:
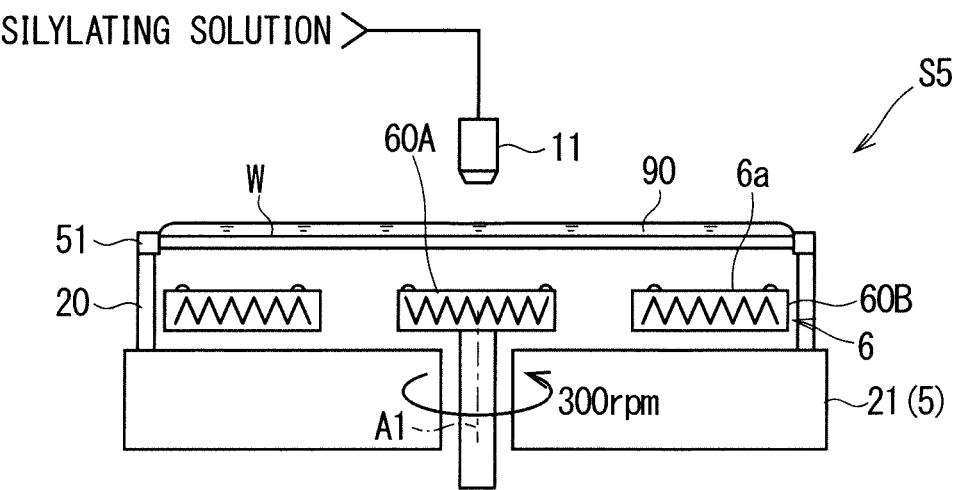
Figure 11:
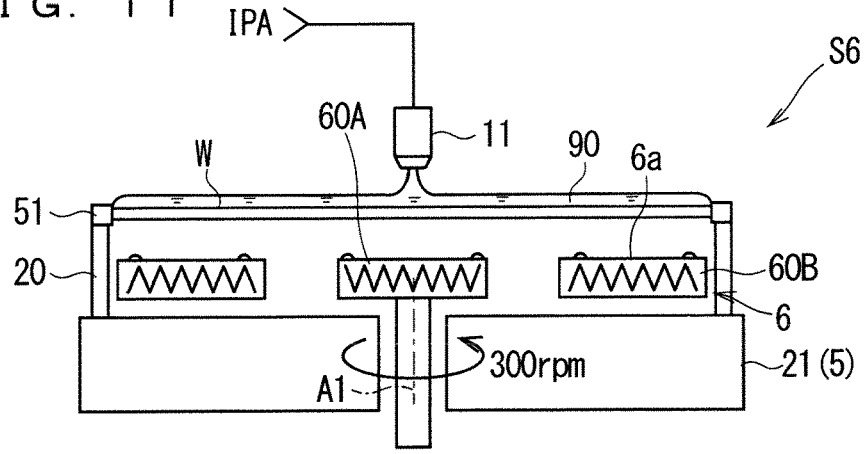
FIG. 11 is a schematic side view for illustrating a state of second solvent supply step S6.

Next, operation of the substrate treatment apparatus 1 will be described. FIG. 8 is a flowchart for illustrating a first treatment example when a substrate W is treated by the substrate treatment apparatus 1 according to the first preferred embodiment. FIG. 9 is a schematic side view for illustrating a state of first solvent supply step S4. FIGS. 10A to 10C each is a schematic side view for illustrating a state of modification treatment liquid supply step S5. FIG. 11 is a schematic side view for illustrating a state of second solvent supply step S6.

In the following description, a substrate W provided in its surface serving as a device forming surface with a thin film pattern 101 (refer to FIG. 12) is to be treated. In addition, "the surface (top surface) of the substrate W" in the following description includes the surface (top surface) of the substrate W itself and the surface of the thin film pattern 101.

An untreated substrate W is transported from the carrier C to the treatment unit 2 by the transport robots IR and CR, and is delivered to the spin chuck 5 in a posture in which the surface, serving as a device forming surface, faces upward (substrate transport-in step S1). At this time, the control unit 3 controls the lifting unit 7 so as to dispose the heater unit 6 at a lower position. The control unit 3 also controls the chuck-pin drive unit 25 so as to cause the chuck pin 20 to be in the open state. In this state, the transport robot CR delivers the substrate W to the spin chuck 5. The substrate W is placed on the support portion 52 (support surface 52a) of the chuck pin 20 in the open state. After that, the control unit 3 controls the chuck pin drive unit 25 so as to cause the chuck pin 20 to be in the closed state. This causes the substrate W to be held by the holding portion 51 of each of the plurality of chuck pins 20. When a substrate W is transported in, the first and second moving nozzles 11 and 12 are each disposed at their home positions (retracted positions) to prevent the transport robot CR and the substrate W from colliding with the first and second moving nozzles 11 and 12.

Subsequently, chemical liquid supply step S2 is performed to supply a chemical liquid to the substrate W. Specifically, while the first moving nozzle 11 is disposed at its home position, the control unit 3 controls the second nozzle moving unit 16 so as to move the second moving nozzle 12 from its home position to a chemical liquid treatment position. The chemical liquid treatment position is a position of the second moving nozzle 12 when the chemical liquid discharged from the second moving nozzle 12 is supplied to a central portion (the rotation center of the top surface) of the top surface of the substrate W held by the spin chuck 5.

In chemical liquid supply step S2, the control unit 3 controls the electric motor 23 so as to rotate the substrate W held by the spin chuck 5. Then, the control unit 3 causes the second moving nozzle 12 to discharge the chemical liquid toward the central portion of the top surface of the substrate W while causing the substrate W to rotate. This causes the chemical liquid to be supplied to the entire top surface of the substrate W to treat the top surface of the substrate W with the chemical liquid (chemical liquid treatment). When the chemical liquid treatment is performed for a predetermined time, the control unit 3 causes the chemical liquid valve 43 to close and the second moving nozzle 12 to stop discharge of the chemical liquid. Then, the control unit 3 controls the second nozzle moving unit 16 so as to move the second moving nozzle 12 to the home position.

While the control unit 3 causes the second moving nozzle 12 to discharge the chemical liquid in the chemical liquid treatment, the supply position on the substrate W, to which the chemical liquid from the second moving nozzle 12 is guided, may be displaced back and forth within a range from the center of rotation of the substrate W to the peripheral portion thereof.

Subsequently, rinse liquid supply step S3 is performed to supply a rinse liquid to the substrate W. Specifically, the control unit 3 causes the DIW valve 47 to open and the DIW nozzle 10 to discharge the rinse liquid (pure water) toward the central portion of the top surface of the substrate W while causing the substrate W held by the spin chuck 5 to rotate. This causes the rinse liquid to be supplied to the entire top surface of the substrate W to wash out the chemical liquid adhering to the substrate W with the rinse liquid (rinse treatment). When the rinse treatment is performed for a predetermined time, the control unit 3 causes the DIW valve 47 to close to stop discharge of the rinse liquid from the DIW nozzle 10.

Subsequently, first solvent supply step S4 of supplying IPA as an example of a solvent to a substrate W is performed. Specifically, while the second moving nozzle 12 is disposed at its home position, the control unit 3 controls the first nozzle moving unit 15 so as to move the first moving nozzle 11 from its home position to a solvent treatment position. Here, the solvent liquid treatment position is a position of the first moving nozzle 11 when the IPA discharged from the first moving nozzle 11 is supplied to a central portion (the rotation center of the top surface) of the top surface of the substrate W held by the spin chuck 5.

In addition, the control unit 3 causes the first and second heaters 63A and 63B to be energized to cause the first and second heater plates 60A and 60B to be a heat generating state. This causes each of the central portion and the peripheral portion of the substrate W to be heated to a predetermined heating temperature (T1) (a temperature higher than a temperature of a silylating solution discharged in modification treatment liquid supply step S5 described below, such as a predetermined temperature within a range of 40° C. to 82.4° C.) (heating step during first solvent supply). After the substrate W is sufficiently heated to the target temperature (T1), the control unit 3 causes the first moving nozzle 11 to discharge IPA while maintaining the energized state of the first and second heaters 63A and 63B. As illustrated in FIG. 9, the first moving nozzle 11 discharges IPA at room temperature (e.g., 23° C. to 25° C.) toward the central portion of the top surface of the substrate W. The IPA guided to the central portion of the top surface of the substrate W spreads toward the peripheral portion thereof along the top surface of the substrate W with the centrifugal force due to the rotation of the substrate W, as illustrated in FIG. 9. This causes the IPA to be supplied to the entire top surface of the substrate W. Thus, the rinse liquid adhering to the top surface of the substrate W is washed away by the IPA to be substituted with the IPA. Here, the central portion and the peripheral portion of the substrate W are heated by the first and second heater plates 60A and 60B, respectively, so that the IPA is heated in the course of flowing over the substrate W. Specifically, temperature of the IPA on the substrate W rises to a temperature similar to the temperature (T1) of the substrate W.

When a predetermined time elapses from the start of supply of IPA, the control unit 3 causes the organic solvent valve 37 to close to stop the discharge of IPA from the first moving nozzle 11. Then, the control unit 3 controls the first nozzle moving unit 15 so as to move the first moving nozzle 11 to its home position.

Subsequently, modification treatment liquid supply step S5 is performed to supply the silylating solution (liquid silylation agent) as an example of a hydrophobic liquid to the substrate W. Specifically, the control unit 3 controls the first nozzle moving unit 15 so as to move the first moving nozzle 11 to a silylation treatment position. The silylation treatment position is a position of the first moving nozzle 11 when the silylating solution discharged from the first moving nozzle 11 is supplied to the central portion (the rotation center of the top surface) of the top surface of the substrate W held by the spin chuck 5. In this context, the solvent treatment position and the silylation treatment position are identical, so that the movement of the first moving nozzle 11 is eliminated.

While maintaining the energization to the first and second heaters 63A and 63B, the control unit 3 causes the hydrophobic liquid valve 38 to open to cause the first moving nozzle 11 to discharge the silylating solution (surface treatment liquid) toward the center of the top surface of the substrate W at room temperature (e.g., 23° C. to 25° C.).

The silylating solution guided to the central portion of the top surface of the substrate W spreads toward the peripheral portion thereof along the top surface of the substrate W with the centrifugal force due to the rotation of the substrate W, as illustrated in FIG. 10A. This causes the silylating solution to be supplied to the entire top surface of the substrate W. Thus, the IPA adhering to the top surface of the substrate W is substituted with the silylating solution. Maintaining the rotation of the substrate W forms a silylating solution film 90 on the top surface of the substrate W.

Subsequently, the control unit 3 lowers the rotation speed of the substrate W and stops it. For example, the control unit 3 lowers the rotation speed of the substrate W from 300 rpm to 50 rpm, and maintains it for a predetermined time (e.g., 10 seconds). Then, the control unit 3 lowers the rotation speed to 10 rpm, and maintains it for a predetermined time (e.g., 10 seconds). After that, the rotation speed is lowered to 0 rpm (stop) and maintained for a predetermined time (e.g., 10 seconds). During this process, the control unit 3 causes the first moving nozzle 11 to continuously discharge the silylating solution. Thus, even when the substrate W stops rotating, the discharge of the silylating solution is continued. When supply of the silylating solution is continued during the entire period from the start of lowering the rotation speed of the substrate W to the stop of the rotation, the silylating solution can be prevented from being lost everywhere on the top surface of the substrate W, as described above. Even after the rotation of the substrate W is stopped, supply of the silylating solution is continued to enable a relatively thick silylating solution film 90 to be formed on the top surface of the substrate W.

The heater unit 6 is disposed at the position identical to that in first solvent supply step S4 until the rotation of the substrate W stops, the position causing the heating face 6a to be spaced downward from the undersurface of the substrate W by a predetermined distance (e.g., 2 mm). Then, the substrate W is preheated by radiant heat from the heating face 6a (preheating step). The chuck pin 20 is switched from the closed state to the open state while the stop state of the substrate W is maintained after the rotation of the substrate W stops. This causes the undersurface of the peripheral portion of the substrate W to be supported from below by the support portion 52 of the chuck pin 20, so that the holding portion 51 is separated from the peripheral portion of the top surface of the substrate W. Then, the second moving nozzle 12 is still disposed at its home position.

Subsequently, lifting step S51 is performed as illustrated in FIG. 10B. The lifting step S51 specifically includes the following steps. First, the control unit 3 causes the heater unit 6 to rise to approach the substrate W (heater unit approaching step). Then, the heating face 6a (specifically, the plurality of support pins 61) of the heater unit 6 is brought into contact with the substrate W (heater unit contact step). The control unit 3 causes the heater unit 6 to rise further to the upper position while the substrate W is supported by the heating face 6a. When the substrate W is lifted with the heater unit 6 as described above, the temperature of the substrate W is raised to a temperature (temperature Ts) higher than the temperature (T1) of the substrate W in first solvent supply step S4. The control unit 3 causes the heater unit 6 to be raised from the lower position to the upper position, and then maintains the state for a predetermined time (e.g., 10 seconds).

The discharge of the silylating solution from the first moving nozzle 11 is continued until the middle of the lifting step. When the heating face 6a of the heater unit 6 is brought into contact with the undersurface of the substrate W, rapid heating of the substrate W due to heat conduction from the heating face 6a is started. Then, the amount of heat applied to the substrate W increases (heat increment step). This heat increment step causes supply of the silylating solution to be continued. This prevents a hole from being formed at an unspecified position of the liquid film 90 of the silylating solution by evaporation of the silylating solution due to sudden temperature rise of the substrate W. The supply of the silylating solution is stopped (supply stop step) when a predetermined time elapses after the heating face 6a of the heater unit 6 is brought into contact with the undersurface of the substrate W (after the heat increment step). Specifically, the control unit 3 causes the hydrophobic liquid valve 38 to close to stop the discharge of the silylating solution from the first moving nozzle 11. At this time, the rotation of the spin chuck 5 is stopped and the second moving nozzle 12 is disposed at its home position. The first moving nozzle 11 is then located above the center of rotation of the substrate W.

After the supply of the silylating solution is stopped, the heater unit 6 is held at the upper position until a predetermined time elapses. The silylating solution supplied to the substrate W is pushed away to an outer peripheral side thereof by the silylating solution newly supplied to the center thereof. In this process, the silylating solution is heated by heat from the top surface of the substrate W heated by the heater unit 6, and rises in temperature. During a period when the supply of the silylating solution is continued, the silylating solution in a central region of the substrate W has a relatively low temperature. Thus, when the heater unit 6 is maintained in a contact state for a predetermined short time after the stop of supply of an organic solvent, the silylating solution in the central region of the substrate W rises in temperature. This enables the liquid film 90 of the silylating solution supported on the top surface of the substrate W to be as uniform in temperature as possible.

In general, a silylating solution is improved in reactivity at high temperature. Thus, when the substrate W is heated by the heater unit 6 to increase temperature of the liquid film 90 of the silylating solution to a high temperature, a high contact angle of liquid can be obtained on the surface of the substrate W.

Subsequently, the control unit 3 lowers the heater unit 6 toward the lower position as illustrated in FIG. 10C. As a result, the substrate W is transported from the heater unit 6 to the support portion 52 of the chuck pin 20, and the heating face 6a faces the undersurface of the substrate W in a non-contact state spaced apart from the undersurface of the substrate W by a predetermined distance. This causes heating of the substrate W to be switched from direct heating from the heating face 6a to heating by radiation heat. Accordingly, the amount of heat to be applied to the substrate W decreases (heat reduction step). This prevents the liquid film 90 of the silylating solution from cracking (particularly cracking in the outer peripheral region of the substrate W) due to evaporation. When the substrate W is delivered to the support portion 52 of each chuck pin 20, each chuck pin 20 is closed to allow its holding portion 51 to hold the substrate W.

In modification treatment liquid supply step S5, when the silylating solution is supplied to the entire top surface of the substrate W, the IPA adhering to the substrate W is substituted with the silylating solution. As a result, the silylating solution enters the inside of the thin film pattern 101 (between adjacent projecting shaped patterns 105), and a hydrophobic protective film 106 (refer to FIG. 12) having low wettability is formed on the top surface of the substrate W (hydrophobic treatment). This causes all the projecting shaped patterns 105 on the top surface of the substrate W to be covered with the hydrophobic protective film 106.

Returning to FIG. 8, when modification treatment liquid supply step S5 is completed, second solvent supply step S6 is performed. In this second solvent supply step, IPA as an example of a solvent is supplied to the substrate W. Specifically, the control unit 3 moves the first moving nozzle 11 to the solvent treatment position as illustrated in FIG. 11. In this context, the solvent treatment position of the first moving nozzle 11 and the silylation treatment position are identical, so that the movement of the first moving nozzle 11 is eliminated.

While maintaining the energization to the first and second heaters 63A and 63B, the control unit 3 causes the organic solvent valve 37 to open to cause the first moving nozzle 11 to discharge the IPA at room temperature (e.g., 23° C. to 25° C.) toward the central portion of the top surface of the substrate W, as illustrated in FIG. 11. The control unit 3 also causes the substrate W held by the chuck pins 20 to rotate. As a result, the IPA guided to the central portion of the top surface of the substrate W spreads toward the peripheral portion thereof along the top surface of the substrate W with the centrifugal force due to the rotation of the substrate W. This causes the IPA to be supplied to the entire top surface of the substrate W. Then, the silylating solution adhering to the top surface of the substrate W is washed away by the IPA to be substituted with the IPA. When a predetermined time elapses from the start of supply of IPA, the control unit 3 causes the organic solvent valve 37 to close to stop the discharge of IPA from the first moving nozzle 11. Then, the control unit 3 controls the first nozzle moving unit 15 so as to move the first moving nozzle 11 to its home position.

Subsequently, drying step S7 of drying the substrate W is performed. Specifically, the control unit 3 controls the electric motor 23 so as to rotate the substrate W at a high rotation speed (e.g., 2500 rpm or more). As a result, a large centrifugal force acts on the IPA adhering to the top surface of the substrate W to scrape away the IPA to the periphery of the substrate W. As described above, the control unit 3 performs drying treatment of drying the substrate W by causing the IPA to be removed from the substrate W. After performing this drying treatment for a predetermined time, the control unit 3 controls the electric motor 23 so as to stop the rotation of the substrate W with the spin chuck 5.

During the drying treatment, the substrate W is heated by radiant heat from the heating face 6a of the heater unit 6. In this way, the substrate W is heated during the drying treatment to heat the IPA remaining on the substrate W. This facilitates volatilization of IPA to enable dryness to be further promoted.

When the drying step is completed, substrate transportout step S8 is then performed. Specifically, after the substrate W rotates for a predetermined time in the drying treatment, the control unit 3 causes each chuck pin 20 to be switched from the closed state to the open state to release holding of the substrate W with each chuck pin 20. Then, the control unit 3 causes the transport robot CR to transport out the treated substrate W from the spin chuck 5.

Figure 12:
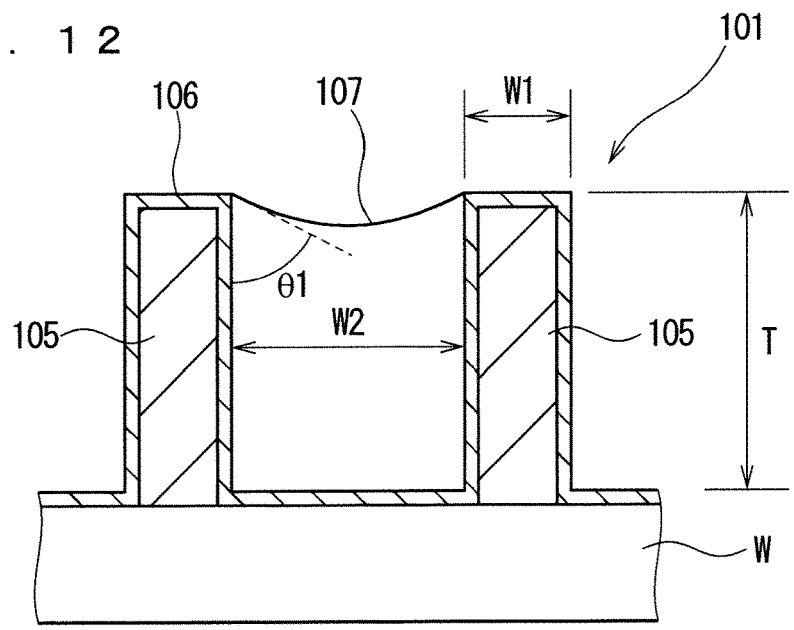
FIG. 12 illustrates an example of a thin film pattern 101 of a substrate W to be treated by the substrate treatment apparatus 1 according to the first preferred embodiment.

FIG. 12 illustrates an example of the thin film pattern 101 of a substrate W to be treated by the substrate treatment apparatus 1 according to the first embodiment. The substrate W to be treated by the substrate treatment apparatus 1 is a silicon (Si) wafer provided on its surface with a fine thin film pattern 101, for example. The thin film pattern 101 is configured such that a plurality of projecting shaped patterns 105 is wired parallel to each other in the same direction, for example. The projecting shaped patterns 105 each have a line width of about 10 nm to 45 nm, for example, and an interval between adjacent projecting shaped patterns 105 and 105 is about 10 nm to several μm, for example.

The thin film pattern 101 includes at least an insulating film. The thin film pattern 101 may include a conductor film. More specifically, the thin film pattern 101 is formed of a laminated film in which a plurality of films is laminated, and may further include an insulating film and a conductor film. The insulating film is an $SiO_2$ film, for example. The conductor film is an amorphous silicon film into which an impurity for reducing resistance is introduced, or a metal film (metal wiring film, etc.), for example. In addition, the laminated film may include a polysilicon film, an SiN film, a BSG film ($SiO_2$ film containing boric acid), or a TEOS film ($SiO_2$ film formed by a CVD method using tetraethoxysilane).

The projecting shaped pattern 105 may have a film thickness T of about 50 nm to 5 μm, for example. The projecting shaped pattern 105 may have an aspect ratio (a ratio of a film thickness T to a line width W1) of about 5 to 500, for example.

As illustrated in FIG. 12, when the projecting shaped pattern 105 is covered with the hydrophobic protective film 106, a contact angle θ1 of a treatment liquid 107 is relatively large (close to a right angle (90° in a state where a part of the surface of the substrate W is wet with the treatment liquid 107 (e.g., IPA).

When the substrate W provided with the projecting shaped pattern 105 is dried, a force attracting each other (surface tension) may occur between the projecting shaped patterns 105 and 105 in the course of drying of the substrate W. A force F1 acting on the projecting shaped pattern 105 is expressed by the following expression (1).

$$F1=(2\times\sigma\times T\times\cos\theta1)/L \qquad \text{Expression (1)}$$

where "σ" is the surface tension of the treatment liquid 107.

According to Expression (1), as σ decreases, the force acting on the projecting shaped pattern 105 is reduced. In the present preferred embodiment, σ can be reduced by forming the hydrophobic protective film 106 on the entire surface of a substrate W. This suppresses collapse of the projecting shaped pattern 105. According to Expression (1), a force to be applied to the projecting shaped pattern 105 is reduced as the contact angle θ1 approaches 90°. Thus, when the surface of a substrate W is made hydrophobic to allow the contact angle θ1 to approach 90°, collapse of the projecting shaped pattern 105 can be suppressed.

When the surface of the substrate W is insufficiently made hydrophobic, the projecting shaped pattern 105 may collapse due to insufficient reduction in the force acting on the projecting shaped pattern 105. Thus, it is desirable to form a good hydrophobic protective film 106 over the entire surface of the substrate W to suppress the collapse of the projecting shaped pattern 105.

Figure 13:
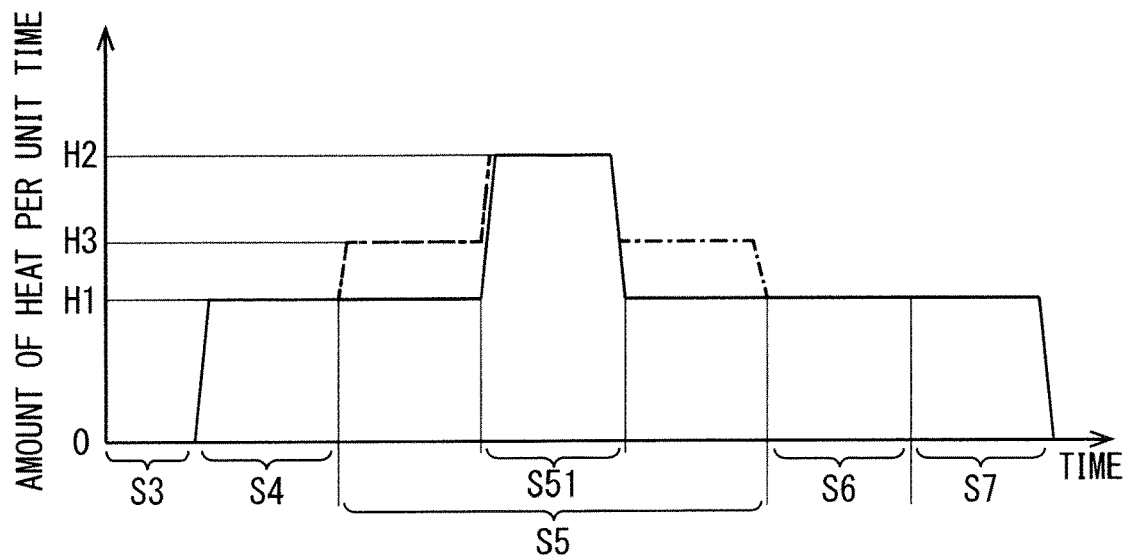
FIG. 13 is a graph showing an example of a variation of the amount of heat per unit time to be applied to a substrate W by the heater unit 6.

FIG. 13 is a graph showing an example of a variation of the amount of heat per unit time to be applied to a substrate W by the heater unit 6. As illustrated in FIG. 13, the amount of heat per unit time (hereinafter also referred to simply as "the amount of heat to be applied") applied to the substrate W by the heater unit 6 is zero until rinse liquid supply step S3 in the present preferred embodiment. In first solvent supply step S4, the control unit 3 controls the heater energization unit 65 so as to heat the substrate W with the heater unit 6. In this first solvent supply step S4, the amount of heat per unit time to be applied to the substrate W by the heater unit 6 is indicated as H1. This amount of heat to be applied H1 causes the substrate W to be heated to the predetermined temperature T1 higher than room temperature.

Subsequently, in modification treatment liquid supply step S5, lifting step S51 is performed to allow the heater unit 6 to rise to approach the substrate W so that the substrate W is lifted and supported. When the heater unit 6 is brought into contact with the substrate W in this lifting step, the amount of heat to be applied increases from H1 to H2 (heat increment step). This causes temperature of the substrate W in lifting step S51 to be set to a temperature Ts higher than the temperature T1 in first solvent supply step S4 (T1<Ts).

As described above, after lifting and supporting the substrate W for a predetermined time, the heater unit 6 descends to deliver the substrate W to the holding portion 51 from the heater unit 6. Then, as the heater unit 6 further descends and moves away from the substrate W, the amount of heat to be applied decreases from H2 to H1 (heat reduction step).

After lifting step S51, the heater unit 6 heats the substrate W at a position away from the substrate W in second solvent supply step S6 and drying step S7. This causes the amount of heat to be applied at this time to be set to H1 lower than H2. As a result, the substrate W in second solvent supply step S6 has a temperature T2 lower than the temperature Ts of the substrate W in lifting step S51 (Ts>T2). Here, the amount of heat to be applied H1 in second solvent supply step S6 is the same as the amount of heat to be applied H1 in first solvent supply step S4. This causes the temperature T2 of the substrate W in second solvent supply step S6 to be substantially identical to the temperature T1 of the substrate W in first solvent supply step S4 (T1≅T2).

As indicated by a dot-and-dash line in FIG. 13, the amount of heat to be applied may be set to H3 larger than H1 after the start of modification treatment liquid supply step S5 (a period of time from the start of supply of the silylating solution to lifting step S51, or a period of time during which a liquid film of the silylating solution is formed).

Here, a mode (1) of allowing the heater unit 6 to approach the substrate W is considered as a mode of increasing the amount of heat to be applied. In this case, the heater unit 6 is raised above the level when the amount of heat to be applied is set to H1 to approach the substrate W, so that the amount of heat to be applied can be set to H3. In addition, a mode (2) of increasing electric power to be applied to each of the first and second heaters 63A and 63B is also conceivable. In this case, the control unit 3 may control the heater energization unit 65 so as to increase the electric power to be applied to each of the first and second heaters 63A and 63B. Both of these modes may be performed in combination.

When the amount of heat to be applied is increased from H1 to H3 as described above, the substrate W can have a temperature higher than the temperature T1 by the start of lifting step S51. This enables the substrate W to rise in temperature to the target temperature Ts in a relatively short time in lifting step S51.

The amount of heat to be applied may be set to H3 larger than H1 after lifting step S51 as indicated by a broken line in FIG. 13. In addition, the amount of heat to be applied may be set to H3 larger than H1 both before and after modification treatment liquid supply step S5.

<Modifications>

Figure 14:
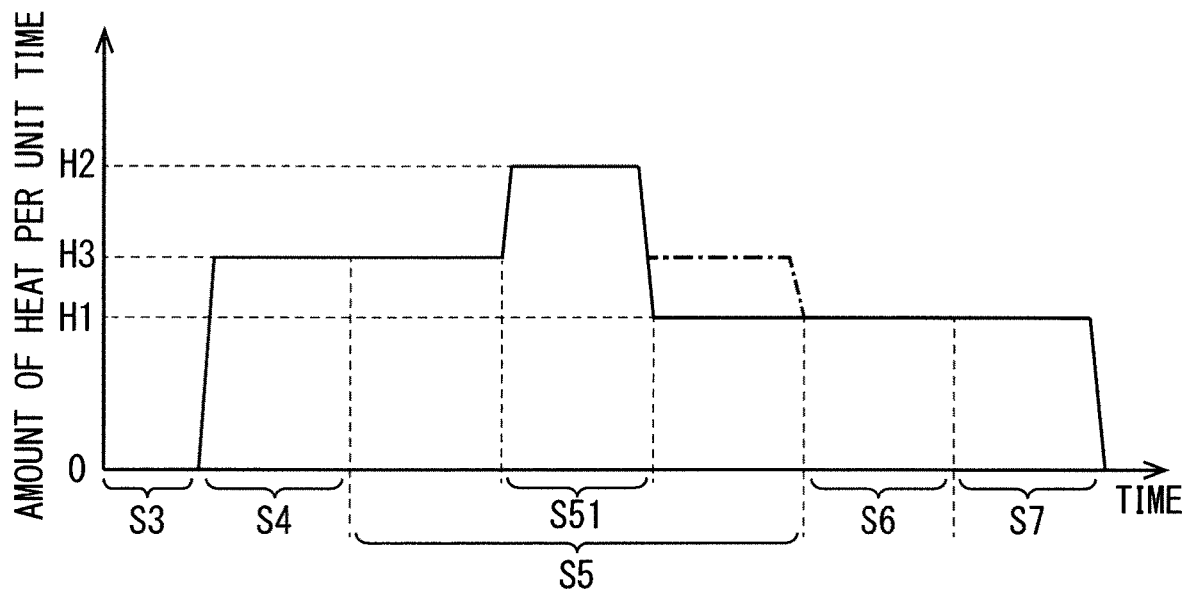
FIGS. 14 and 15 are each a graph showing another example of a variation of the amount of heat per unit time to be applied to a substrate W by the heater unit 6.

FIG. 14 is a graph showing another example of a variation of the amount of heat per unit time to be applied to a substrate W by the heater unit 6. In the example illustrated in FIG. 14, the amount of heat to be applied in first solvent supply step S4 is set to H3 larger than H1 in second solvent supply step S6. The amount of heat to be applied H3 is smaller than the amount of heat to be applied H2 in lifting step S51. When the amount of heat to be applied in first solvent supply step S4 is made relatively large as described above, a substrate W can be preheated to a relatively high temperature. This enables the substrate W to be suitably treated with a silylating solution in modification treatment liquid supply step S5.

Figure 15:
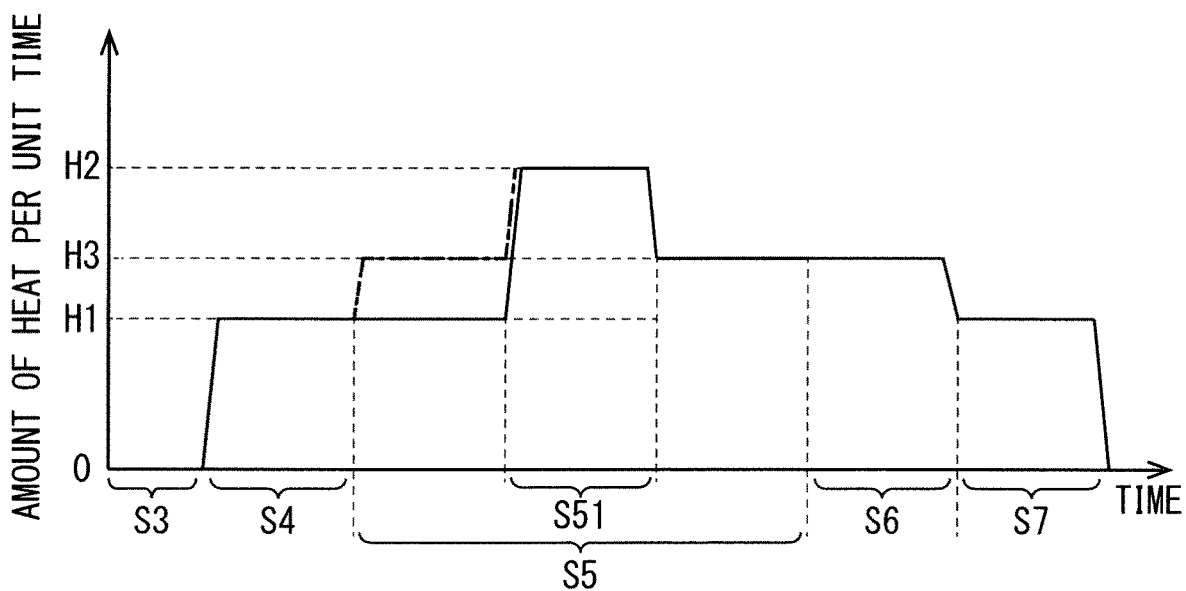

FIG. 15 is a graph showing another example of a variation of the amount of heat per unit time to be applied to a substrate W by the heater unit 6. In the example illustrated in FIG. 15, the amount of heat to be applied in second solvent supply step S6 is set to H3 larger than H1 in first solvent supply step S4. The amount of heat to be applied H3 is smaller than the amount of heat to be applied H2 in lifting step S51. In addition, the amount of heat to be applied during a period of time after lifting step S51 in modification treatment liquid supply step S5 is set to H3 and the amount of heat to be applied is maintained at H3 until treatment proceeds to second solvent supply step S6.

When the relatively high amount of heat to be applied H3 is set in second solvent supply step S6 as described above, substitution of the IPA for the silylating solution can be promoted. This enables the silylating solution to be suitably removed.

Figure 16:
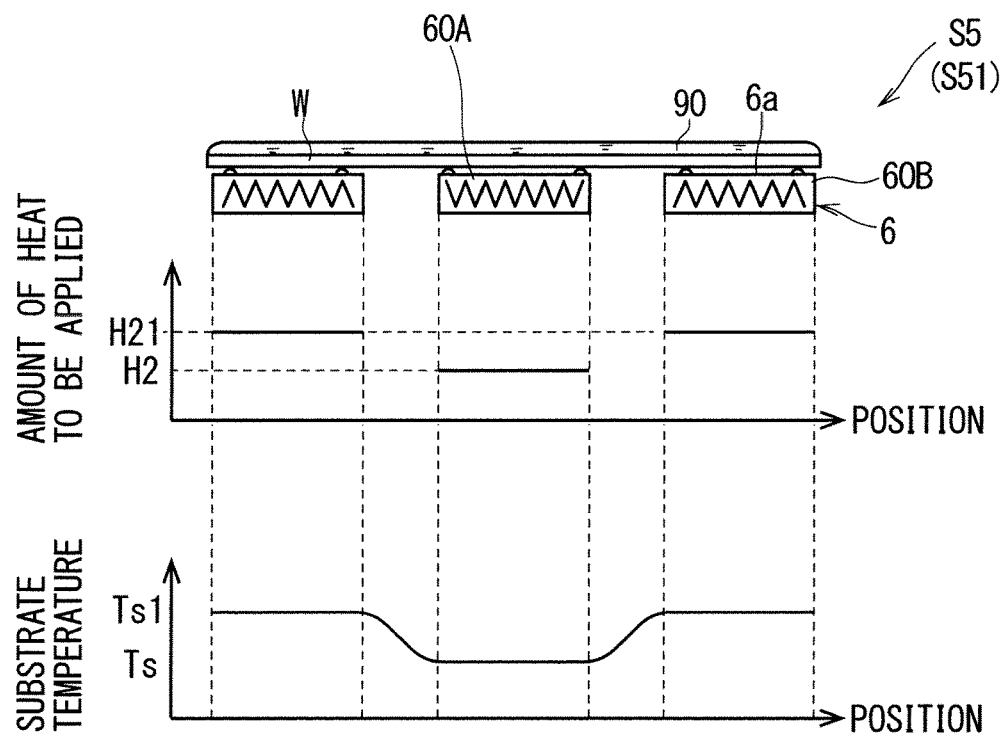
FIGS. 16 and 17 each illustrate an example of heating of a substrate W in lifting step S51.

FIG. 16 illustrates another example of heating of a substrate W in lifting step S51. In the example illustrated in FIG. 16, an amount of heat to be applied H21 of the second heater plate 60B for heating the peripheral portion of a substrate W is set higher than the amount of heat to be applied H2 of the first heater plate 60A for heating the central portion thereof in the heater unit 6 in lifting step S51. This difference in the amount of heat to be applied is based on a difference in electric power to be applied to the first and second heaters 63A and 63B by the heater energization unit 65.

When a difference is made in the amount of heat to be applied as described above, the outer peripheral portion of the substrate W can have a temperature (Ts1) larger than the temperature (Ts) of the central portion of the substrate W in lifting step S51. When it is difficult to heat the silylating solution in the outer peripheral portion of the substrate W due to environmental reasons, giving a gradient to the amount of heat to be applied as described above facilitates a temperature rise of the silylating solution in the outer peripheral portion thereof to a desired temperature. This enables a liquid film to be uniform in temperature regardless of the outer peripheral portion and the central portion of the substrate W.

Figure 17:
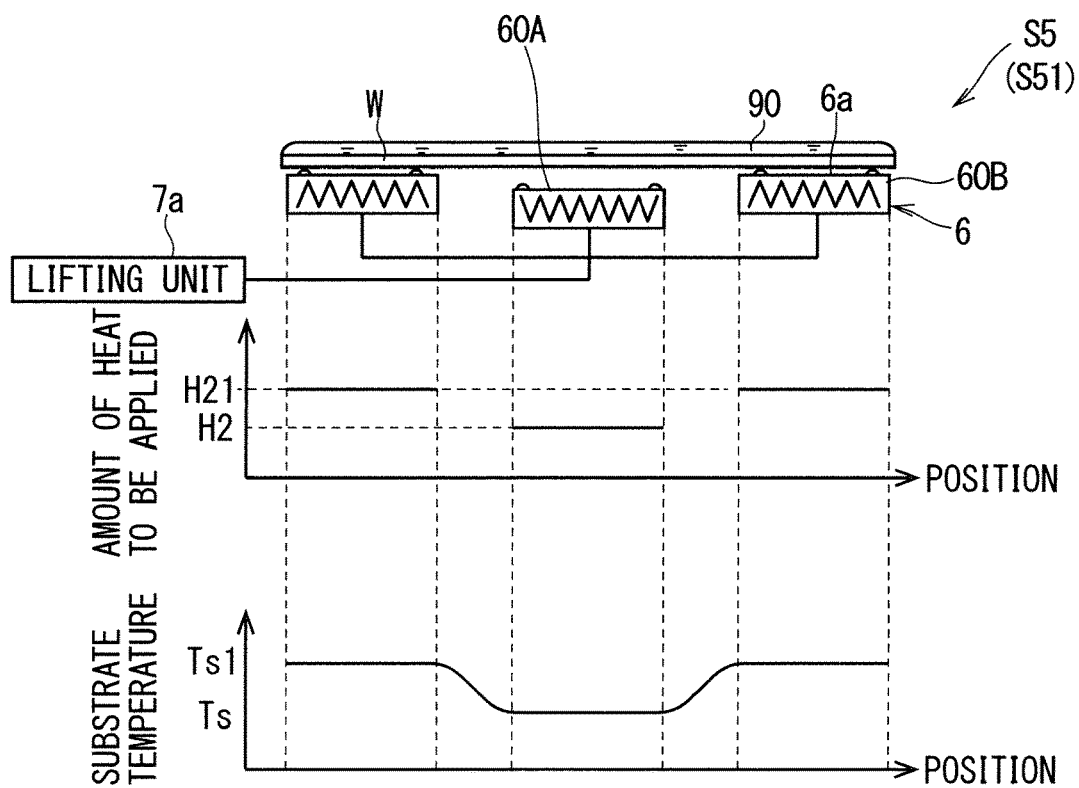

FIG. 17 illustrates yet another example of heating of a substrate W in lifting step S51. In the example illustrated in FIG. 17 as in FIG. 16, the amount of heat to be applied H21 of the second heater plate 60B for heating the peripheral portion of a substrate W is also set higher than the amount of heat to be applied H2 of the first heater plate 60A for heating the central portion thereof in the heater unit 6 in lifting step S51. However, the present example uses a lifting unit 7a that vertically moves the first and second heater plates 60A and 60B independently of each other. Then, the control unit 3 controls the lift unit 7a so as to dispose the first heater plate 60A at a position below the second heater plate 60B. Here, only the second heater plate 60B is disposed at a position to lift and support the substrate W, and the first heater plate 60A is disposed at a position away from the substrate W downward. This case causes a difference in the amount of heat to be applied between the first and second heater plates 60A and 60B. As a result, the outer peripheral portion of the substrate W can have the temperature (Ts1) larger than the temperature (Ts) of the central portion of the substrate W.

2. Second Preferred Embodiment

Next, a second preferred embodiment will be described. In the following description, an element having the same function as that already described will be denoted by the same reference sign or a reference sign added with an alphabet letter, and detailed description may be eliminated.

Figure 18A:
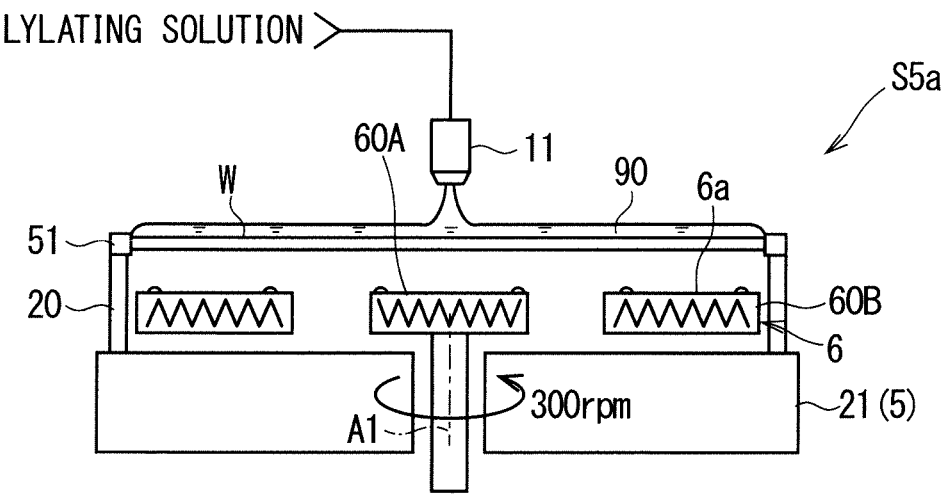
FIG. 18A is a schematic side view for illustrating a state of modification treatment liquid supply step S5a according to the second preferred embodiment.
Figure 18B:
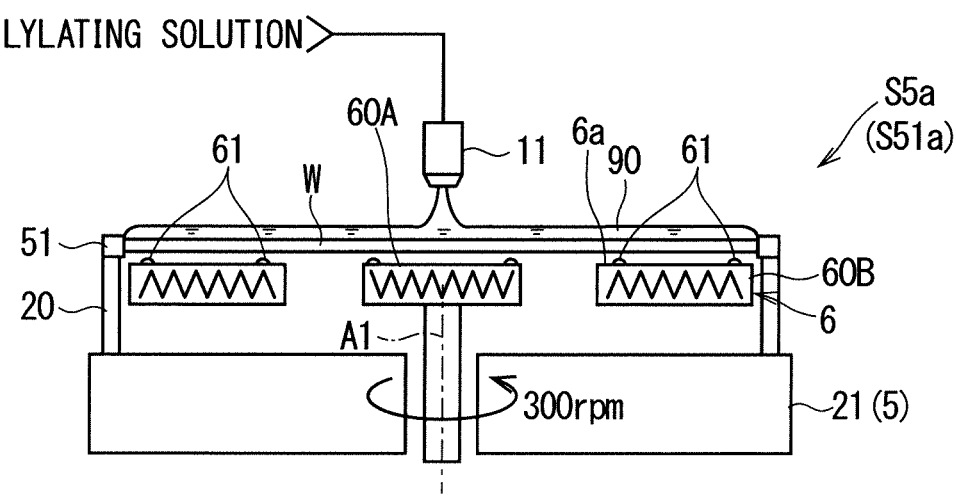
FIG. 18B is a schematic side view for illustrating a state of modification treatment liquid supply step S5a according to the second preferred embodiment.
Figure 18C:
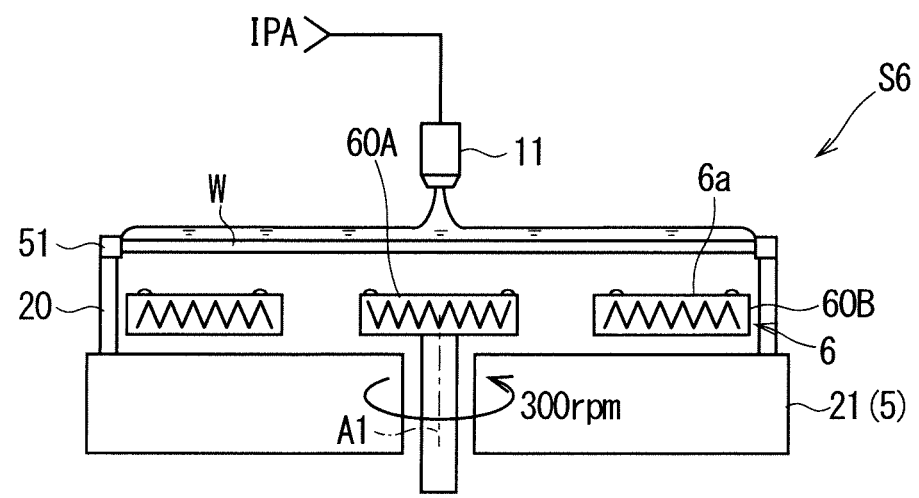
FIG. 18C is a schematic side view for illustrating a state of second solvent supply step S6 according to the second preferred embodiment.

FIGS. 18A to 18C each is a schematic side view for illustrating a state of the corresponding one of modification treatment liquid supply step S5a and second solvent supply step S6. In modification treatment liquid supply step S5a illustrated in FIGS. 18A to 18C, a liquid film 90 of the silylating solution is formed as in modification treatment liquid supply step S5. However, in modification treatment liquid supply step S5a, heater approaching step S51a (refer to FIG. 18B) is performed in place of lifting step S51 performed in modification treatment liquid supply step S5.

Heater approaching step S51a is performed after the silylating solution spreads over the entire top surface of the substrate W. Heater approaching step S51a is a step of increasing the amount of heat to be applied to the substrate W by allowing the heater unit 6 to approach the substrate W rotating while being held by the chuck pins 20. The rotation speed of the substrate W is 300 rpm, for example. While supply of the silylating solution is stopped in lifting step S51, the supply of the silylating solution is continued in heater approaching step S51a.

When a predetermined time elapses after the heater unit 6 approaches the substrate W, the heater unit 6 descends and separates from the substrate W to reduce the amount of heat to be applied to the substrate W. Then, heater approaching step S51a is completed.

Here, while the substrate W is being rotated, the treatment liquid discharged from the first moving nozzle 11 is switched from the silylating solution to the IPA. This causes the liquid film of the silylating solution formed on the surface of the substrate W to be substituted with IPA from the central portion to the outer peripheral portion.

When heater approaching step S51a is performed instead of lifting step S51 as described above, the chuck pins 20 are not required to be opened and closed. This enables treatment time of the substrate W to be shortened. In addition, the substrate W is not lifted by the heater unit 6, so that the plurality of support pins 61 formed on the corresponding surfaces of the first and second heater plates 60A and 60B may be eliminated.

When the treatment liquid discharged from the first moving nozzle 11 is continuously switched from the silylating solution to the IPA, treatment can promptly shift from modification treatment liquid supply step S5 to second solvent supply step S6. This enables treatment time of the substrate W to be shortened. Discharge of the IPA may be performed when a predetermined time elapses after discharge of the silylating solution is stopped. This case enables the IPA to be supplied after the silylating solution is substantially removed by rotation of the substrate W. As a result, the amount of the IPA to be used can be reduced.

3. Modification

While the preferred embodiments are described above, the present invention is not limited to the above-described embodiments, and various modifications are available.

For example, while there is described an example in which a silylating solution that makes the surface of a substrate W hydrophobic is used as a surface treatment liquid in modification treatment liquid supply step S5 in the above-described embodiments, the present invention is also effective even when another treatment liquid for changing chemical properties of the surface is used. For example, a hydrophilic treatment liquid for making the surface of a substrate W hydrophilic may be used in modification treatment liquid supply step S5.

While a substrate W is heated by the heater unit 6 serving as a heating unit in each of the above preferred embodiments, fluid supply means for supplying a high-temperature gas (e.g., inert gas such as heated nitrogen gas, argon gas, helium gas, etc.) or heated water to the back surface of the substrate W may be provided.

While the invention has been shown and described in detail, the foregoing description is in all aspects illustrative and not restrictive. It is therefore understood that numerous modifications and variations can be devised without departing from the scope of the invention.

What is claimed is:

1. A substrate treatment method for treating a surface of a substrate, comprising the steps of: (a) treating a substrate by supplying a first treatment liquid to a surface of the substrate while rotating the substrate; (b) forming a liquid film on said surface of said substrate after said step (a) by supplying a modification treatment liquid for changing surface chemical properties of said surface; and (c) heating said substrate during said steps (a) and (b), wherein said step (c) is configured such that an amount of heat per unit time being applied to said substrate in said step (b) is more than an amount of heat per unit time being applied to said substrate in said step (a), said step (c) also includes applying said amount of heat in steps (a) and (b) to said substrate from a heating unit disposed on a back surface side of said substrate, said step (b) includes the steps of: (b-1) forming said liquid film of said modification treatment liquid by spreading said modification treatment liquid supplied to said rotating substrate on an outer peripheral portion of said substrate; and (b-2) maintaining said liquid film of said modification treatment liquid after said step (b-1), and said step (c) is configured such that the amount of heat per unit time to be applied to said substrate in said step (b-2) is more than the amount of heat per unit time to be applied to said substrate in said step (b-1), and said step (b-2) includes the steps of lifting and supporting said substrate with said heater unit by elevating said heater unit in a state where said liquid film is maintained on said substrate, and delivering said substrate to a holding portion by lowering said heater unit in a state where said liquid film is maintained on said substrate.

2. The substrate treatment method according to claim 1, wherein
said step (c) includes a step of increasing the amount of heat to be applied to said substrate by causing said heating unit to approach said substrate.

3. The substrate treatment method according to claim 1, wherein
said step (c) includes a step of increasing the amount of heat to be applied to said substrate by raising temperature of said heating unit.

4. The substrate treatment method according to claim 1, wherein
said step (c) is configured such that the amount of heat per unit time to be applied to the outer peripheral portion of said substrate is more than the amount of heat per unit time to be applied to a central portion of said substrate in said step (b-2).

5. The substrate treatment method according to claim 1, further comprising the step of:
(d) supplying a second treatment liquid to said surface of said substrate while rotating the substrate after said step (b).

6. The substrate treatment method according to claim 5, wherein
said step (c) includes the step of heating said substrate in said step (d), and
the amount of heat per unit time to be applied to said substrate in said step (b) is more than the amount of heat per unit time to be applied to said substrate in said step (d).

7. The substrate treatment method according to claim 6, wherein
said step (c) is configured such that the amount of heat per unit time to be applied to said substrate in said step (a) is more than the amount of heat per unit time to be applied to said substrate in said step (d).

8. The substrate treatment method according to claim 6, wherein
said step (c) is configured such that the amount of heat per unit time to be applied to said substrate in said step (d) is more than the amount of heat per unit time to be applied to said substrate in said step (a), and
said second treatment liquid in said step (d) contains isopropyl alcohol.

9. The substrate treatment method according to claim 1, further comprising the step of:
(e) drying said substrate by rotating said substrate at a higher speed than a rotation speed of said substrate in said step (a) after said step (b).

10. The substrate treatment method according to claim 1, wherein
said first treatment liquid in said step (a) contains isopropyl alcohol.

* * * * *